US006100716A

United States Patent [19]
Adham et al.

[11] Patent Number: 6,100,716
[45] Date of Patent: Aug. 8, 2000

[54] VOLTAGE EXCURSION DETECTION APPARATUS

[75] Inventors: Sarnan M. I. Adham, Kanata; Yvon Savaria, Montreal; Bernard Antaki, Roxboro; Nanhan Xiong, Burlington, all of Canada

[73] Assignee: Nortel Networks Corporation, Montreal, Canada

[21] Appl. No.: 09/154,569

[22] Filed: Sep. 17, 1998

[51] Int. Cl.[7] ..................... H03K 19/03; H03K 19/0175; H03K 5/08

[52] U.S. Cl. .............................. 326/68; 326/68; 326/126; 326/127; 326/89; 326/90; 326/18; 327/58; 327/62; 327/318; 327/321

[58] Field of Search .............................. 326/68, 126, 127, 326/89, 90, 18; 327/58, 62, 318, 321

[56] References Cited

U.S. PATENT DOCUMENTS

| | | | |
|---|---|---|---|
| 4,604,531 | 8/1986 | Gersbach et al. | 307/445 |
| 4,902,916 | 2/1990 | Cecchi et al. | 307/455 |
| 5,072,136 | 12/1991 | Naghshineh | 307/455 |
| 5,177,379 | 1/1993 | Matsumoto | 307/455 |
| 5,334,886 | 8/1994 | Chuang | 307/455 |
| 5,479,005 | 12/1995 | Okawa | 326/110 |
| 5,514,984 | 5/1996 | Nakamura | 326/126 |
| 5,751,169 | 5/1998 | Keating | 326/126 |
| 5,877,642 | 3/1999 | Takahashi | 327/207 |

OTHER PUBLICATIONS

"Design Considerations for Very–High–Speed Si–Bipolar IC's Operating Up to 50 Gb/s", H.–M. Rein et al., IEEE Journal of Solid–State Circuits, vol. 31, No. 8, pp. 1076–1089, Aug. 1996.

"High Performance Digital VLSI Circuit Design", R.X. Gu et al., Kluwer Academic Publishers, 312 pages, chapters 6 and 8, Boston, 1996.

"Fault Characterization and Testability Analysis of Emitter Coupled Logic and Comparison wth CMOS & BiCMOS Circuits", M.O. Esonu et al., VLSI Design, vol. 1, No. 4, pp. 261–276, 1994.

"Fault Modeling of ECL for High Fault Coverage of Physical Defects", S.M. Menon et al., VLSI Design, vol. 4, No. 3, pp. 231–242, 1996.

"Emitter Coupled Logic and Cascode Current Switch Testability and Design for Test", F. Anderson, IEEE Southern Technical Conference, pp. 119–127, Oct. 1988.

"ECL Fault Modelling", C. Morandi et al., IEE Proceedings, vol. 135, Pt. E, No. 6, pp. 312–317, Nov. 1988.

"Modelling and Analysis of Bridging Faults in Emitter–Coupled Logic (ECL) Circuits", S.M. Menon et al., IEE Proceedings–E, vol. 140, No. 4, pp. 220–226, Jul. 1993.

"A Soft–Error–Immune 0.9–ns 1.15–Mb ECL–CMOS SRAM with 30–ps 120k Logic Gates and On–Chip Test Circuitry", K. Higeta et al., IEEE 1995 Bipolar Circuits and Technology Meeting, pp. 47–50, 1995.

"Built–In Self–Test for High Speed Integrated Circuits", U. Jorczyk et al., SPIE, vol. 2874, pp. 162–172, 1996.

"Producing Reliable Initialization of Test Sequential Circuits with Pseudorandom Vectors", M. Soufi et al., IEEE Transactions on Computers, vol. 44, No. 10, pp. 1251–1255, Oct. 1995.

*Primary Examiner*—Michael Tokar
*Assistant Examiner*—Vibol Tan
*Attorney, Agent, or Firm*—Angela C. de Wilton

[57] ABSTRACT

It is common that the presence of a defect causes abnormal gate output voltage excursions in data buffers, AND gates, OR gates and multiplexers in current-mode logic circuits. A voltage excursion is detected by a voltage excursion detection apparatus which includes a built-in detector. The detector, which is little overhead, is used to monitor output swings of all gates (differential circuits) and flags all abnormal voltage excursions. These detection results cover classes of faults that cannot be tested by stuck-at testing methods only. The voltage detection apparatus works well below "at-speed" frequencies.

32 Claims, 26 Drawing Sheets

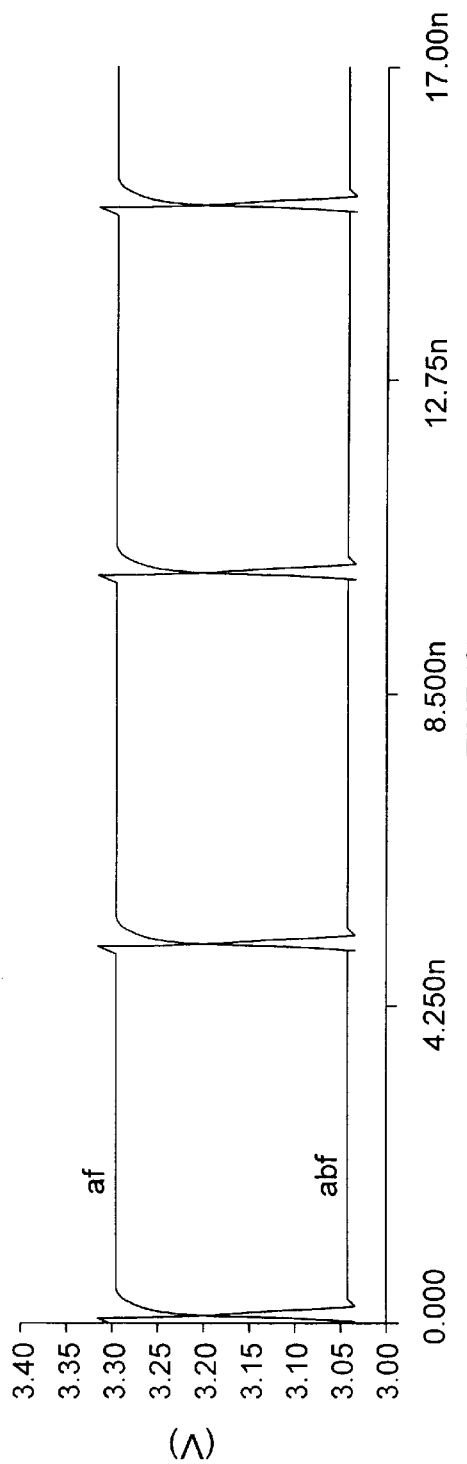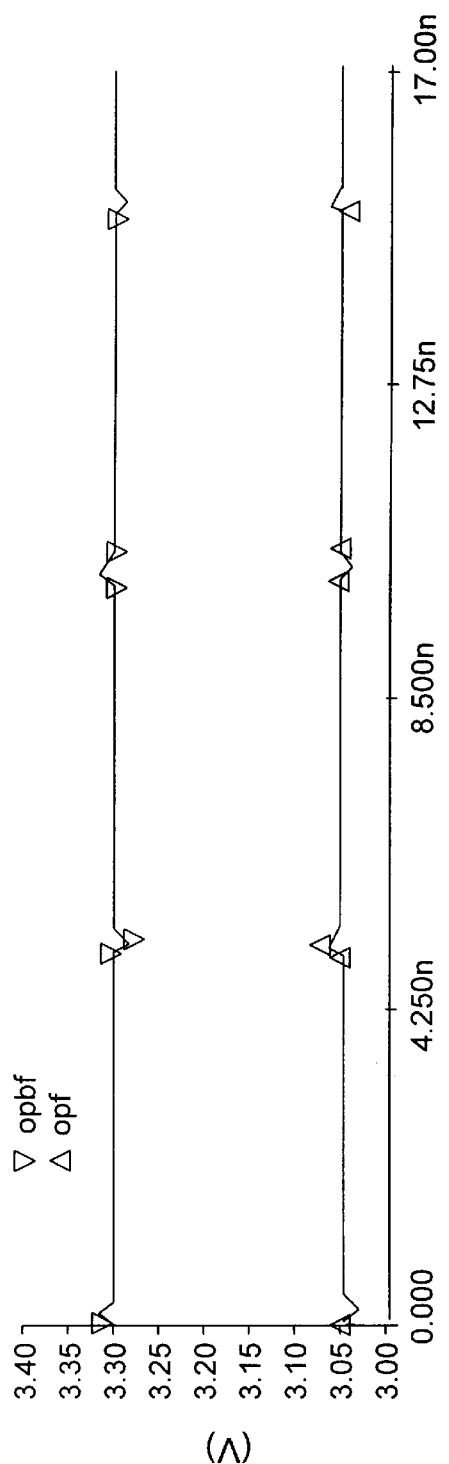

VOLTAGE EXCURSION DETECTION APPARATUS

TECHNICAL FIELD

The present invention relates to an integrated circuit and a test method for detection of a voltage excursion in semiconductor circuits, for example, emitter coupled logic (ECL) circuits and current-mode logic (CML) circuits with built-in testability.

BACKGROUND INFORMATION

As technology improves with time, some design techniques such as ECL and CML, once set aside, are now reconsidered. Due to that technological evolution, device area has decreased significantly and dynamic power dissipation has been reduced with the size of transistors. For example, a paper by H. -M. Rein et al. entitled "Design Considerations for Very-High-Speed Si-Bipolar IC's Operating Up to 50 Gb/s", IEEE Journal of Solid-State Circuits, Vol. 31, No. 8, pp. 1076–1089, August 1996, reports circuits which lead to gate delays far below 1 ns and bit rates of up to 50 Gb/s. ECL/CML bipolar technologies have an edge over CMOS when speed is the main concern. For example, architectures of Gb/s transceivers described by R. X. Gu et al., "High Performance Digital VLSI Circuit Design", Kluwer Academic Publishers, Boston, 312 pages, Chapters 6 and 8,1996, are implemented in two level CML and ECL circuits.

Considering the growing popularity of CML circuits, their testability should be assessed carefully. A quick look at the literature shows that ECL/CML testability has not been thoroughly studied. It appears that due to their market dominance, MOS technologies have attracted most of the attention of the industrial and scientific community. However, some recent works on ECL/CML testability have shown that these circuits have unique fault sensitivities, and that testability of classical stuck-at faults is far from providing sufficient defect coverage. See M. O. Esonu et al., "Fault Characterization and Testability Analysis of Emitter Coupled Logic and Comparison with CMOS & BiCMOS Circuits", VLSI Design, Vol. 1, No. 4, pp 261–276,1994; S. M. Menon, Y. K. Malaiya et al., "Fault Modeling of ECL for High Fault Coverage of Physical Defects", VLSI Design, Vol. 4, No. 3, pp. 231–242,1996; F. Anderson, "Emitter Coupled Logic and Cascode Current Switch Testability and Design for Test", IEEE Southern Technical Conference, pp. 119–126, October 1988; and U. Jorczyk, W. Daehn and O. Neumann, "Fault Modeling of Differential ECL", EURO-DAC 1995, pp. 190–195, April 1995.

Furthermore, it is shown that ECL combinational gate chains have a tendency to heal back from faults in the first stages (see F. Anderson publication). Frequently reported faults are line stuck-at faults, truth-table faults, like, wired-OR, byzantine, reduced noise-margin, undefined logic-level, delay, feedback oscillation, sequential behaviour and quiescent current $I_{ddq}$.

For example, the "line stuck-at" faults are described by Esonu et al. 1994 publication and C. Morandi et al., "ECL Fault Modelling", IEE Proceedings, Vol. 135, Pt. E, No. 6, pp. 312–317, November 1988. The "truth-table" faults are described by Esonu et al. 1994 publication. The "like" is described by S. M. Menon, Y. K. Malaiya, and A. P. Jayasumana 1996 publication. The "wired-OR" is described by S. M. Menon, A. P. Jayasumana, Y. K. Malaiya, and D. R. Clinkinbeard, "Modelling and Analysis of Bridging Faults in Emitter-Coupled Logic (ECL) Circuits", IEE Proceedings-E, Vol. 140, No. 4, pp. 220–226, July 1993. The "byzantine" faults are described by F. Anderson 1988 publication. The "reduced noise-margin" is described by Esonu et al 1994 publication; and F. Anderson 1988 publication. The "undefined logic-level" is described by U. Jorczyk, W. Daehn and O. Neumann 1995 publication and S. M. Menon, A. P. Jayasumana, Y. K. Malaiya, D. R. Clinkinbeard 1993 publication. The "delay" faults are described by Esonu et al. 1994 publication and U. Jorczyk, W. Daehn and O. Neumann 1995 publication. The "feedback oscillation" faults are described by S. M. Menon, A. P. Jayasumana, Y. K. Malaiya, D. R. Clinkinbeard 1993 publication. The "sequential behaviour" faults are described by S. M. Menon, A. P. Jayasumana, Y. K. Malaiya, D. R. Clinkinbeard 1993 publication. The "quiescent current $I_{ddq}$" faults are described by Esonu et al. 1994 publication.

The probable manufacturing defects causing these faults are inter-connect and resistor shorts or opens, piped transistors, bridges (wires making contact) and broken lines (see Esonu et al. 1994, Menon/Malaiya/Jayasumana 1996, and Jorczyk/Daehn/Neumann 1995).

To deal with the observed variety of faults, design for testability methods of several flavours were proposed. For instance, a simple technique to test for like-faults in ECL was devised by Menon (see Menon/Malaiya/Jayasumana 1996). The proposed technique uses a standard XOR gate to verify the complementary behaviour of the gate outputs. This technique introduces a very high area overhead (one test gate for every circuit gate), and it deals only with a very specific and not so frequent fault. Delay measurement techniques have been developed to test ECL-CMOS RAM macros (see K. Higeta et al., "A Soft Error-Immune 0.9 ns 1.15 Mb ECL-CMOS SRAM with 30 ps 120 k Logic Gates and Onchip Test Circuitry", IEEE 1995 Bipolar Circuits and Technology Meeting, pp. 47–50, 1995). Using ECL flip-flops on the inputs and outputs of the CMOS RAM macros and using a pattern generator to stimulate the memories, Higeta et al. measured the path delay within the macros in test clock cycles. This technique may be useful for CML circuits, however it cannot fully test for even obvious delay faults. Considering that each gate can have a modest variation in delay of 10% of nominal value, a tester evaluating a 10 gate deep chain could escape a faulty gate going twice slower than nominal, when all others have their nominal delay value. Also, an at-speed built-in self-test (BIST) circuit was proposed by Jorczyk et al. (see U. Jorczyk, W. Daehn, "Built-in self-test for high speed integrated circuits", SPIE, Vol. 2874, pp. 162–172, 1996) to test ECL integrated circuits, and it is shown that it yields a better defect detection than slow speed test. However, this technique requires significant design efforts and high area overhead.

To deal with the problem of reduced noise-margins and of fault symptoms healing, Anderson presents a technique that would stress a circuit enough to make the recovery impossible, forcing the fault to appear as stuck-at (see Anderson publication and U.S. Pat. No. 4,604,531 granted to Gersbach et al on Aug. 5, 1986). This technique uses two additional power lines in test mode to bias the differential stage of all gates one way or the other. Small devices are added to each gate to isolate the circuit from the additional lines in normal mode and to protect the circuit from unwanted noise and loading. U.S. Pat. No. 4,902,916 entitled "Identification of defects in emitter-coupled logic circuits" granted to Cecchi et al. on Feb. 20, 1990 discloses another technique oriented toward a specific fault that could not be observed easily. The cause of the fault had been pinpointed to a probable defect related to the contact layer.

Through modification of the layout of standard cells, they are able to guarantee that any defect within this layer could only map into a stuck-at fault.

SUMMARY OF THE INVENTION

It is an object of the present invention to provide an improved circuit and test method for detection of a voltage excursion in semiconductor circuits.

According to one aspect of the present invention, there is provided an integrated circuit comprising: data output means operable by first and second operating voltages, the data output means comprising a first transistor circuit for providing output voltage between first and second circuit nodes thereof in response to at least one input signal; and a detector coupled operable by a third operating voltage, the detector being coupled to the data output means, the detector comprising an impedance circuit and a detection circuit which is coupled to the impedance circuit, the third operating voltage being fed to the detection circuit via the impedance circuit, the detection circuit including a second transistor circuit which operates in response to the output voltage of the first transistor circuit, the detector providing an output indicating an abnormal voltage excursion.

In the integrated circuit, the first transistor circuit of the data output means provides output voltage between first and second circuit nodes, in response to the input signal. The detector, which is coupled to the data output means, provides the output indicating an abnormal voltage excursion, in response to the output voltage from the first transistor circuit. From the output of the detector, output swings can be monitored and abnormal voltage excursions are detected. This works well below "at-speed" frequencies.

For example, the impedance circuit comprises an impedance element connected between first and second terminals, the impedance element being a capacitive circuit including a parallel-connected capacitor and resistor. The resistor is a linear or non-linear resistance element.

The data output means includes one first transistor circuit or a plurality of first transistor circuits. The first transistor circuit is a logic circuit such as a data buffer, an AND gate, an OR gate or a multiplexer including a differential amplifier transistors. The logic circuit and the impedance capacitive circuit are operable by dc voltages. The detection means provides the output in response to the input signal.

Also, the logic circuit is operable by dc voltages and the impedance capacitive impedance circuit is operable by a variable voltage for testing. The detector provides the output in response to the input signal and the test variable voltage.

In the integrated circuit, in response to the applied test signal, the detector provides the output indicating an abnormal voltage excursion from the second circuitry means.

In the integrated circuit including data output means having a plurality of first transistor circuit, the detector provides a fault detection signal from the plurality of the transistor circuits. From the detection signal, output swings can be monitored and abnormal voltage excursions are detected. This works well below "at-speed" frequencies.

The integrated circuit consists in implementing built-in detectors at the output of each logic circuit. Instead of testing the circuits at the primary outputs, the testing is performed on all logic circuit through the built-in detectors.

The integrated circuit may use a multiple emitter transistor for detecting, the area overhead for the circuit thereof is reduced.

According to another aspect of the present invention, there is provided a circuit test method comprising the steps of: configuring data output circuit comprising a first transistor circuit having first and second circuit nodes; configuring a detector comprising an impedance circuit and a detection circuit which is coupled to the impedance circuit; associating the detector with the data output circuit; operating the data output circuit by first and second operating voltages; operating the detector by a third operating voltage; feeding the third operating voltage to the detection circuit via the impedance circuit; feeding at least one input signal to the first transistor circuit of the data output circuit, so that the first transistor circuit provides output voltage between the first and second circuit nodes, in response to the input signal; and providing an output indicating an abnormal voltage excursion from the detector.

For example, the step of configuring the data output circuit comprises the step of configuring a plurality of first transistor circuits; the step of configuring the detector comprises the step of an impedance circuit and a plurality of detection circuits which is coupled to the impedance circuit; and the step of associating the detector with the data output circuit comprises the step of associating each of the detection circuit with the respective first transistor circuit.

According to another aspect of the present invention, there is provided a circuit test method comprising the steps of: configuring a chain of transistor circuits, each having first and second circuit nodes which are connected to inputs of the other transistor circuit; sensitizing outputs one after the other transistor circuit; and applying toggling input signals.

BRIEF DESCRIPTION OF THE DRAWINGS

Embodiments of the present invention will now be described by way of example with reference to the accompanying drawings in which:

FIG. 2A illustrates input pair signals fed to a buffer having a defect;

FIG. 2B illustrates output pair signals provided by the buffer having the defect;

DETAILED DESCRIPTION

I. Applicable Circuits

The present invention is applicable to any integrated circuit which has two nodes for providing an output voltage. Typical circuits are CML circuits, the circuit level of which is well adapted to fast bipolar digital circuit libraries. It is based upon a simple differential amplifier.

Figure 1A:
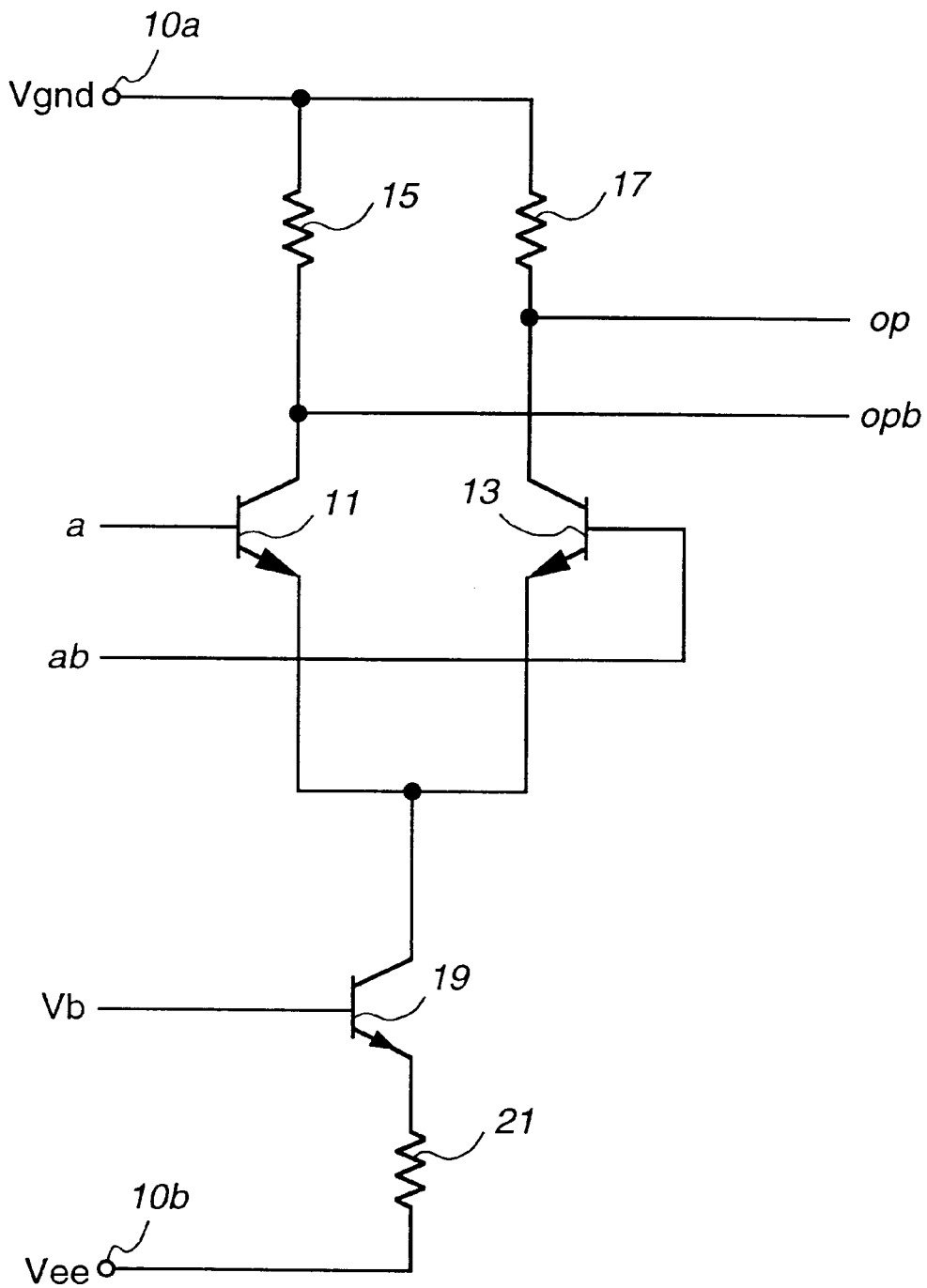
FIG. 1A is a schematic diagram of a data buffer.

FIG. 1A shows a basic data buffer in CML circuits connected to high and low operating voltage terminals 10a and 10b. The buffer includes a differential amplifier of a pair transistors 11 and 13, the collectors of which are connected to the high operating voltage terminal 10a via resistors 15 and 17 (e.g., 1 kΩ), respectively. The coupled emitters of the transistors 11 and 13 are connected to a current source circuit of a transistor 19 and a resistor 21 (e.g., 1.2 kΩ) which is connected to the low operating voltage terminal 10b. In this example, the ground level voltage Vgnd (0 volts) and voltage Vee (e.g., -3.3 volts) are fed to the high and low operating voltage terminals 10a and 10b, respectively. If the low operating voltage terminal 10b is provided with the ground level voltage, the high operating voltage terminal 10a will be provided with +3.3 volts. The transistor 19 supplies stable "sink" current to the transistors 11 and 13. To stabilize the sink current, an environment independent voltage generator (not shown) feeds the base of transistor 19 with a fixed bias voltage Vb. The power of this design comes from its functional simplicity. The transistors 11 and 13 steer the steady current through one of the two branches by turning on one transistor or the other with gate inputs (signals a and ab). The current in the selected branch will create a voltage drop across its resistor, while in the other branch, where no current flows, the output voltage is kept to the ground level voltage Vgnd. The collectors of the transistors 11 and 13 form a pair used as gate outputs (signals op and opb). In CML, each digital signal is thus represented by the voltage difference between two nodes, which increases the gate's noise margin. This differential signal is large enough to fully steer the current flowing in the gates it drives. The signals a and ab represent input data and the signals op and opb represent output data in a differential form.

To implement more complex gates, vertical stacking of differential pairs is used. Stacked pairs are also used to steer the bias current to produce the desired function. To make sure the gate functions correctly, one must always make sure that the current has a path through a branch to the voltage Vgnd. Due to the fixed power supply voltage, stacking is limited. To avoid forward-biased base to collector junctions of lower differential pairs, gate outputs must be level shifted by one base-emitter offset voltage $V_{BE}$ before driving them.

Several advantages of CML logic families lie in suitable circuit design. High speed derives from non-saturated current steering and small voltage swings (~250 mV). Current steering limits dI/dt in the supply rails irrespective of circuit activity. Crosstalk is reduced due to paired differential signals, cancelling much of the independent magnetic fields they generate. A second notable advantage of using CML differential signals is the high signal to noise ratio while keeping a small output signal swing. Also, small output swings provides a reduction in dynamic power consumption. Furthermore, CML gates always provide a signal and its complement which simplifies circuits and reduces logical depth when inverted signals are needed.

Figure 1B:
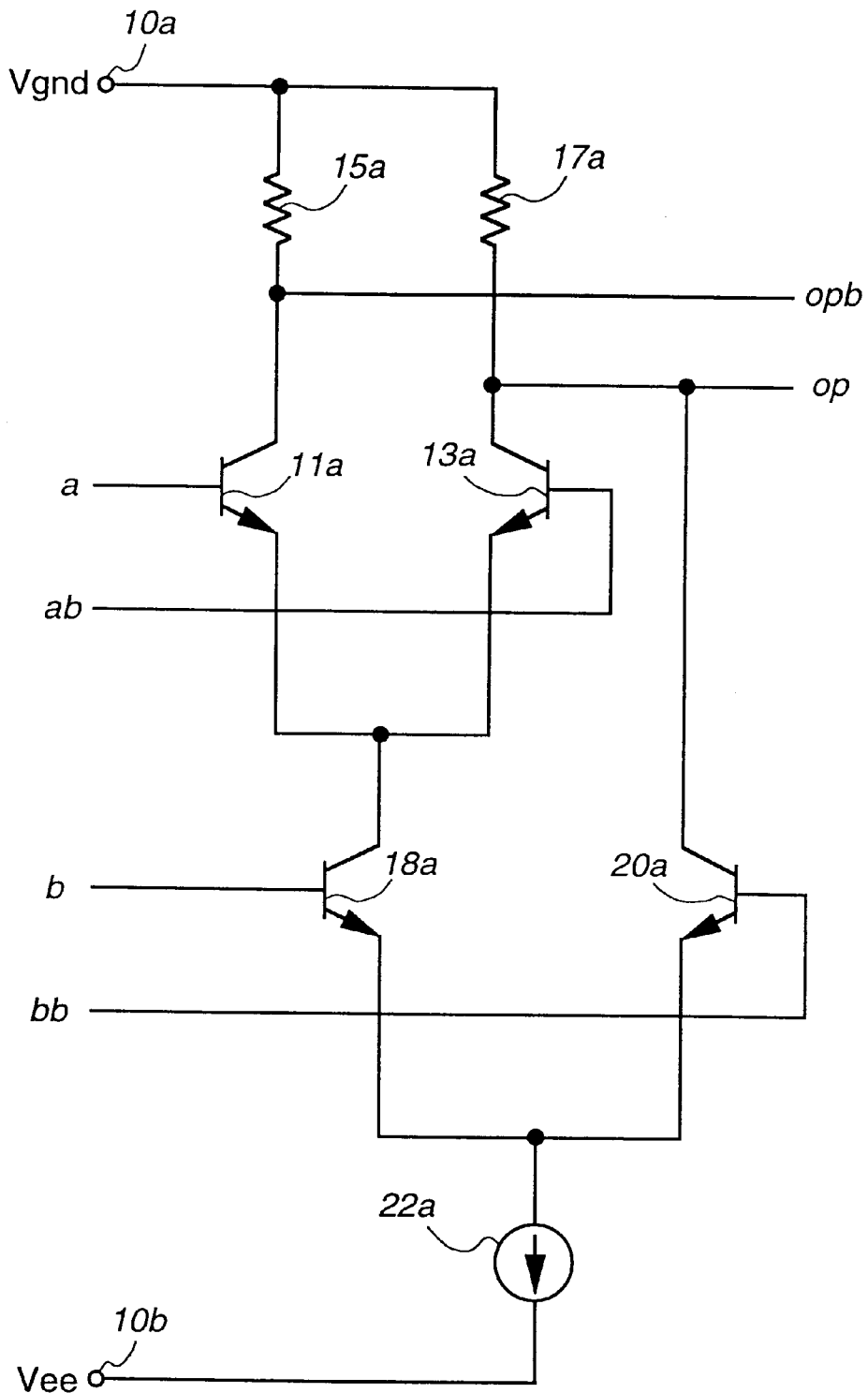
FIG. 1B is a schematic diagram of an AND gate.

FIG. 1B shows an AND gate in CML circuits which includes a differential amplifier of a pair transistors 11a and 13a, the collectors of which are connected to the high operating voltage terminal 10a via resistors 15a and 17a, respectively. The coupled emitters of the transistors 11a and 13a are connected to the collector of a transistor 18a. The collector of the transistor 13a is connected to the collector of a transistor 20a. The emitters of the transistors 18a and 20a are connected to a current source 22a which is connected to the low operating voltage terminal 10b. One differential input A (a, ab) is fed to the bases of the transistors 11a, 13a. Another differential input B (b, bb) is fed to the bases of the transistors 18a, 20a. An AND logic output (op, opb) is provided from the collectors of the transistors 13a, 11a.

Figure 1C:
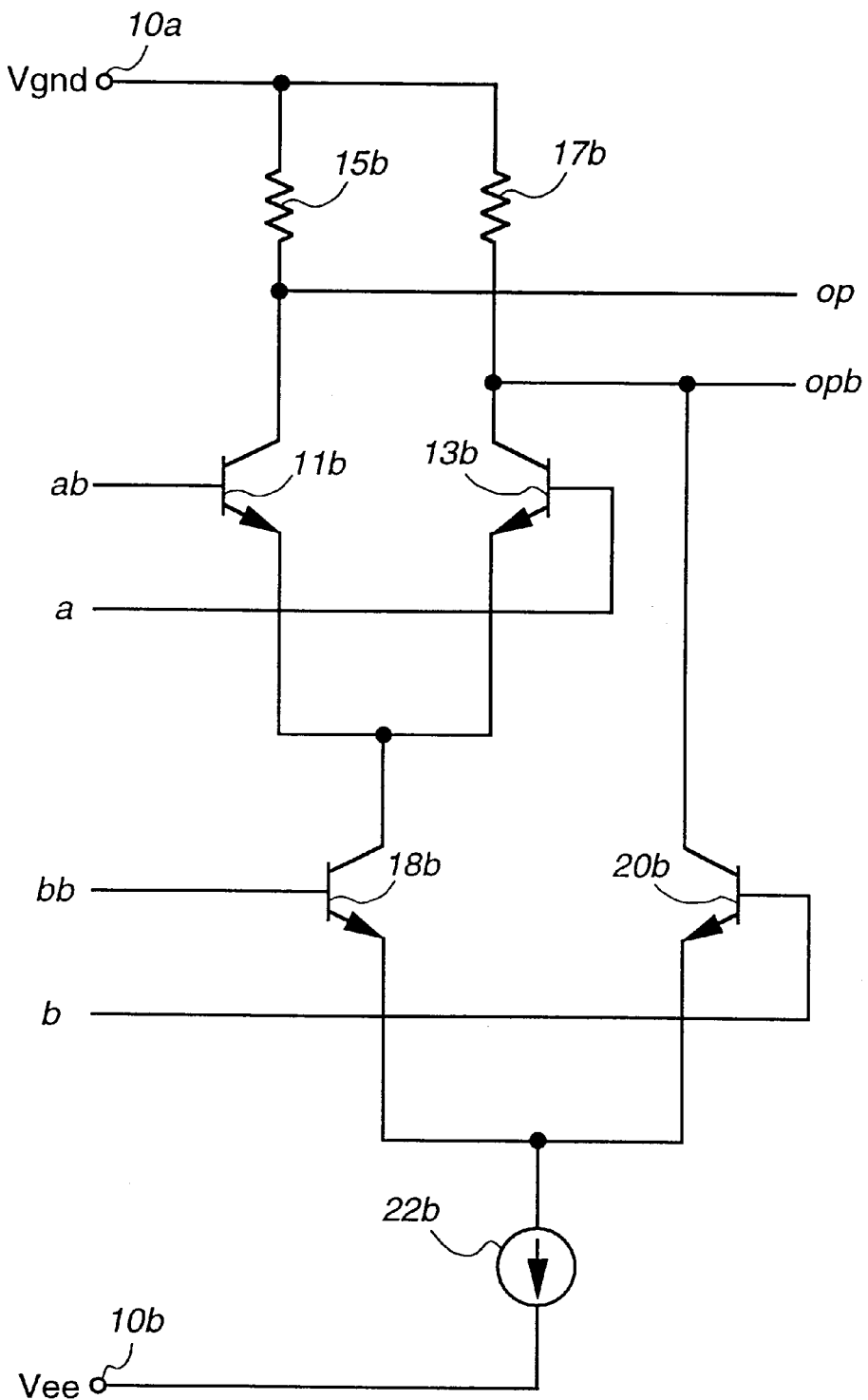
FIG. 1C is a schematic diagram of an OR gate.

FIG. 1C shows an OR gate in CML circuits which includes a differential amplifier of a pair transistors 11b and 13b, the collectors of which are connected to the high operating voltage terminal 10a via resistors 15b and 17b, respectively. The coupled emitters of the transistors 11b and 13b are connected to the collector of a transistor 18b. The collector of the transistor 13b is connected to the collector of a transistor 20b. The emitters of the transistors 18b and 20b are connected to a current source 22b which is connected to the low operating voltage terminal 10b. One differential input A (a, ab) is fed to the bases of the transistors 13b, 11b. Another differential input B (b, bb) is fed to the bases of the transistors 20b, 18b. An OR logic output (op, opb) is provided from the collectors of the transistors 11b, 13b.

Figure 1D:
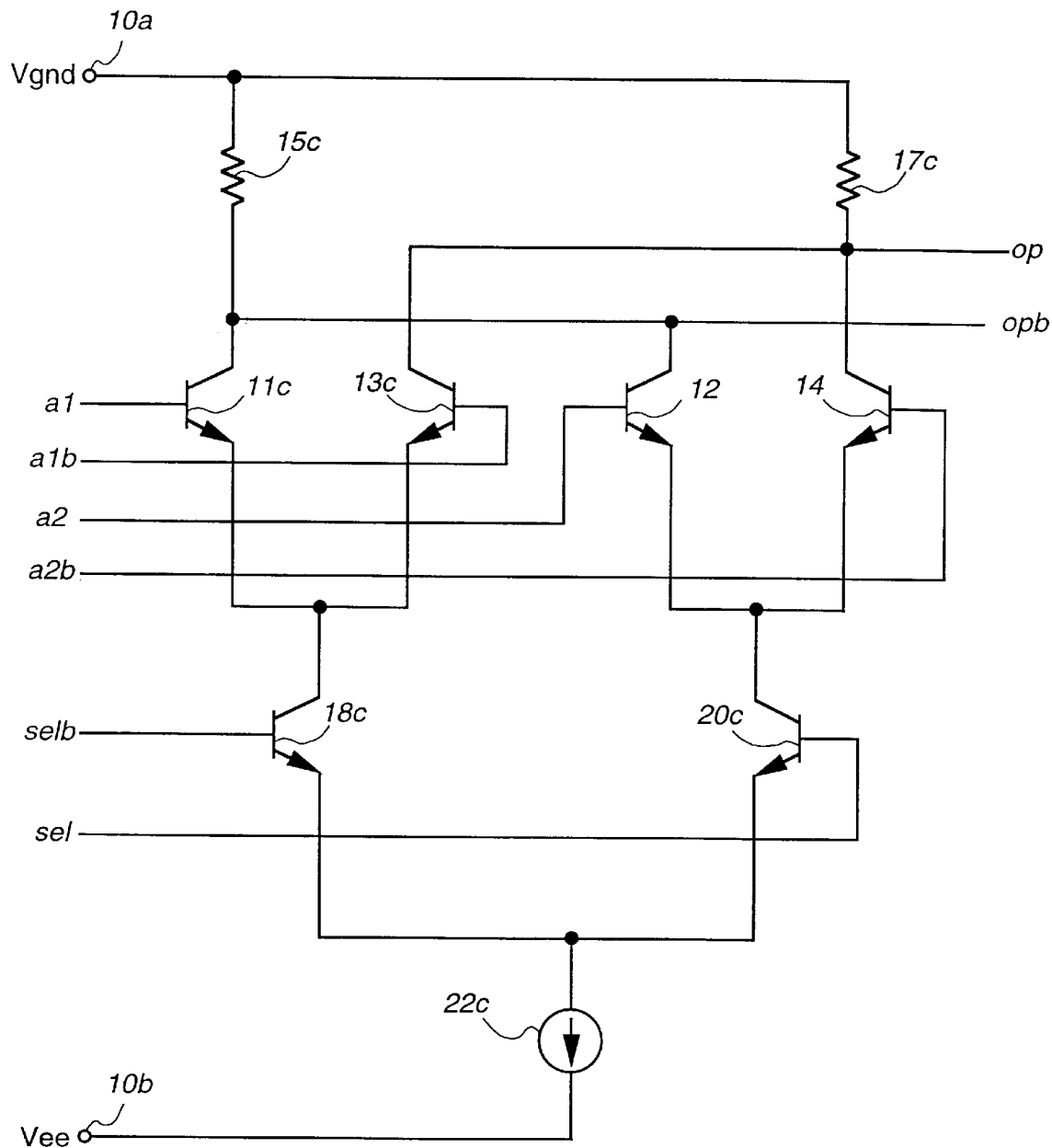
FIG. 1D is a schematic diagram of a multiplexer.
Figure 3A:
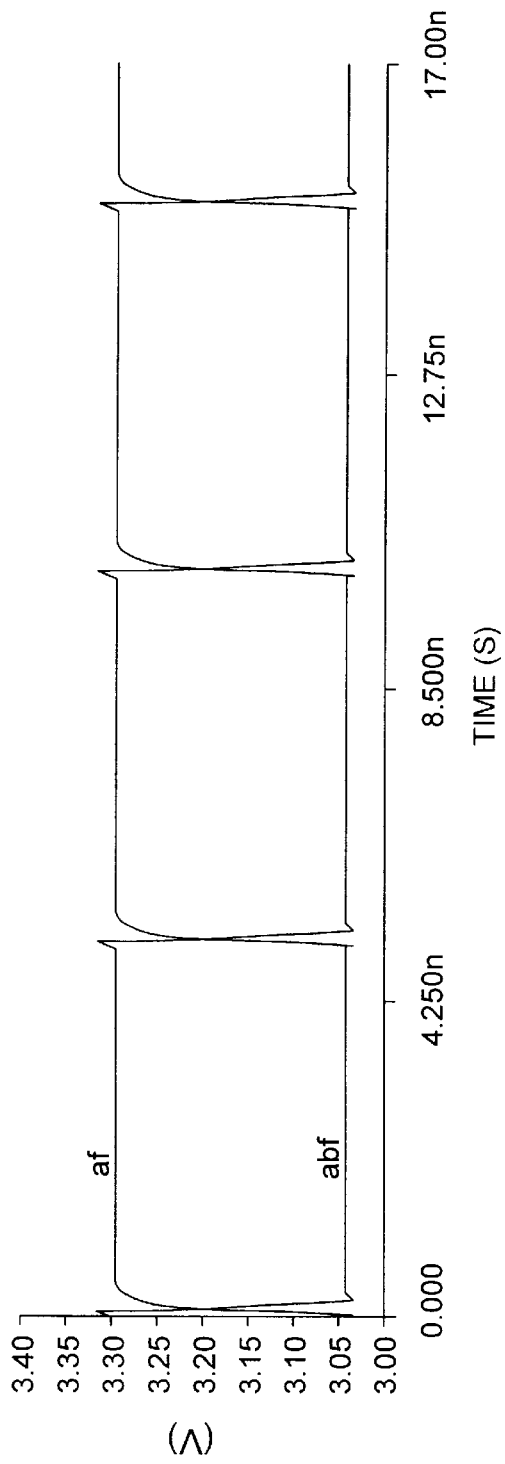
FIG. 3A illustrates input pair signals fed to a buffer having another defect.
Figure 3B:
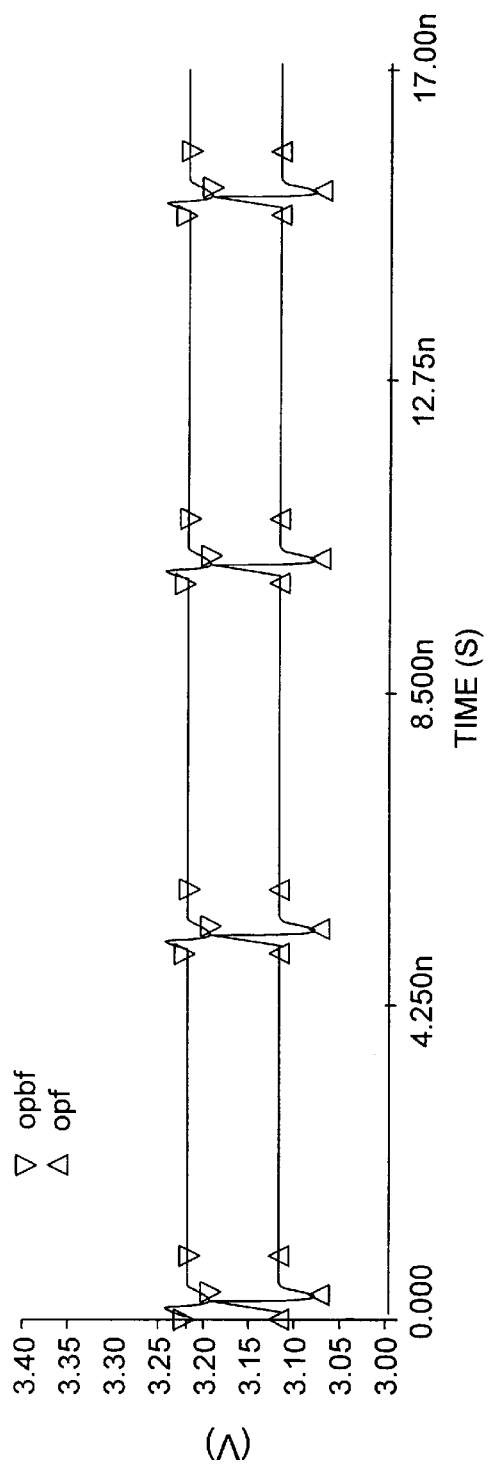
FIG. 3B illustrates output pair signals provided by the buffer having the defect.
Figure 4A:
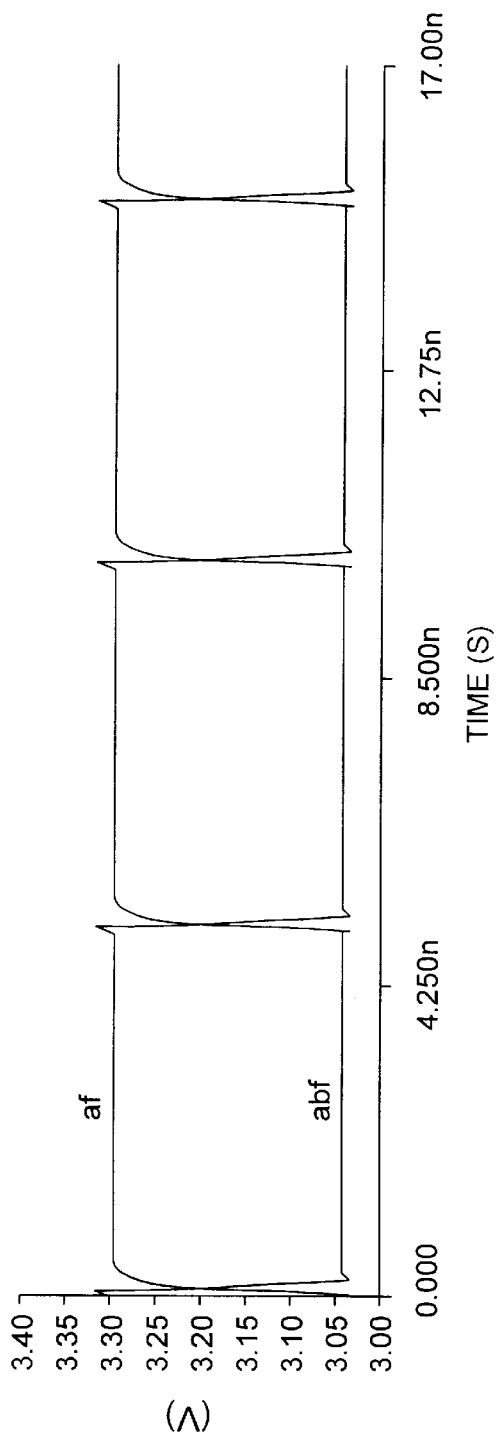
FIG. 4A illustrates input pair signals fed to a buffer having another defect.
Figure 4B:
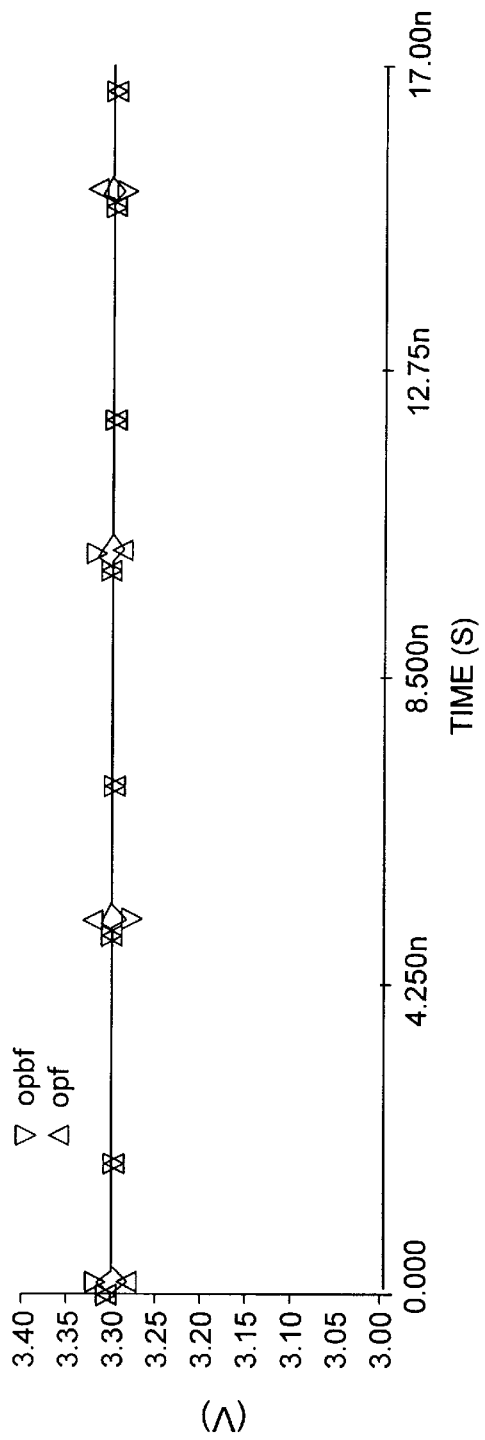
FIG. 4B illustrates output pair signals provided by the buffer having the defect.

FIG. 1D shows a multiplexer in CML circuits which includes a differential amplifier of two pairs of transistors 11c, 13c and 12, 14. The collectors of the transistors 11c and 13c are connected to the high operating voltage terminal 10a via resistors 15c and 17c, respectively. The collectors of the transistors 12 and 14 are connected to the collectors of the transistors 11c and 13c, respectively. The coupled emitters of the transistors 11c and 13c are connected to the collector of a transistor 18c. Similarly, the coupled emitters of the transistors 12 and 14 are connected to the collector of a transistor 20c. The emitters of the transistors 18c and 20c are connected to a current source 22c which is connected to the low operating voltage terminal 10b. One differential input A1 (a1, a1b) is fed to the bases of the transistors 11c, 13c. Another differential input A2 (a2, a2b) is fed to the bases of the transistors 12, 14. A selection control input Sel (sel, selb) is fed to the bases of the transistors 20c, 18c. A multiplexed output (op, opb) is provided from the collectors of the transistors 13c, 11c.

II. Defects Encountered In CML Circuits

This section analyses possible defects in CML circuits. Throughout the literature, different defects encountered in bipolar processes have been exposed and some corresponding low level fault models are suggested. This section briefly reviews the most common types of defects.

Semiconductors manufacturing processes are subject to various imperfections and parametric variations that cause segments of layers to be connected together, a segment to be severed or a layer to have a thickness smaller than expected. For instance, if a layer is significantly thinner on a localized region, this region may fuse due to electromigration. If the current that flows through the layer is in the plane of the die, the segment of layer may end up severed. But, if the current flows in a direction orthogonal to the plane of the die, like in the case of a contact, one layer may be isolated, while current still flows between layer segments above or underneath.

Another class of defects is associated with bipolar devices. Bipolar transistors are characterized by a current gain which is determined by the base thickness. That thickness may be modulated by various phenomenon. For instance, the so-called dislocations of the active semiconductor layer are physical imperfections that can modulate the effective base thickness, when they fall in the base region. This generally creates a spot of very high gain and excessive leakage current, which is known as a collector to emitter pipe. Vertical transistors (usually NPN) are more prone to piping.

Severed segments, also called opens, are commonly found at transistor nodes, wires and resistor strips. Shorts are found as well between transistor nodes and resistors. Finally, bridges are resistive shorts between metal layers, 'bridging' two signals together.

The above defects can be modelled with good accuracy at the device level (e.g., transistor and resistor). Such models include shorts, bridges, opens or pipes. Thus, in a circuit simulator, a resistor of small value (~1 Ω) can be used to model shorts and bridges. To simulate an open, a node is split and a 100 MΩ resistor is added in parallel to a 1 pF capacitor to link the two parts together. The pipe is usually modelled by a resistor of a few kΩ between the collector and emitter of a transistor.

III. Fault Models

This section presents the corresponding fault models. Device level modelling is the most accurate way to simulate the effects of defects, but it is usually too complex, and accurate device level models of defective components are not available. Similarly, one could attempt to analyse all faults to uncover the defects that caused them, but that is impractical. A better way to deal with the problem is to identify the electrical consequences of defects within the circuit so that the results could be relayed to output pins when the chip is fully packaged. Such a model is called a fault model. Of course, to validate a list of probable faults, it is necessary to see it happen in a defective circuit.

Fault models found in the literature for ECL/CML circuits are numerous. As in CMOS, some defects produce stuck-at faults. FIGS. 2A and 2B show the effect on a simple data buffer of a collector to emitter short on the transistor 13 shown in FIG. 1 causing an output stuck-at 0 fault. The input pair signals are named af and abf and the output pair signals are named opf and opbf.

However, with several defects, it was found that the complement output continued to function, which leads to so called line stuck-at fault. Some gates show, in presence of defects, a significant difference in delay (higher or lower) in transmitting signals. Other defects produce differences in gate output voltage that degrade noise margins. Also, cases which are called 'like' faults where the two outputs of a gate have lost their complementary behaviour have been reported in ECL circuits. Furthermore, it is well known that some defects in ECL circuits may create wired-OR interpretations of two signals. This relates to the single ended nature of logic signals in ECL coupled with the presence of emitter followers in that logic family. Therefore, this fault type is not applicable to CML.

Another fault model is applicable to ECL, when, for a specific input combination, a cell does not function well and gives the wrong output; this is called a truth-table fault. Some truth-table faults can be interpreted as stuck-at fault, but not all of them. Furthermore, it has been found that certain combinational gates have shown sequential behaviour in presence of a defect, having some kind of a memory of previous outputs while not being stuck-at. Finally, some defective ECL circuits have shown an increase in quiescent current $I_{ddq}$ where the current source sinks more current from the power supply.

Some of these fault models are commonly applicale to CMOS circuits. For instance, delay, noise-margin, stuck-at and quiescent current $I_{ddq}$ faults are also found in CMOS. Usually, in CMOS, voltage transfer characteristic faults lead to reduced noise-margins characterized by smaller signal swings. However, in ECL/CML, signal swing and noise margins can also increase in presence of defects as will be shown in section 5. A gate with this type of fault will work, and its signal will be propagated to the next gates, often producing undetectable faults, which might cause a reliability problem.

Simulations have shown that several defects map into increased noise-margins, or more simply, produce a low logic voltage much lower than the standard Vlow. A testing technique to detect these faults should help to increase the fault coverage if combined with other fault models.

IV. Defect Injection And Circuit Behaviour

The method is validated with realistic circuit level fault simulations. The studied circuit level faults are: transistor pipes, transistor node opens, transistor node shorts, bridges, open in wires, resistor shorts and resistor opens.

Results show that some defects can cause an output low voltage level to be much lower than the normal value. This method is applicable, but not limited, to that particular class of faults which in many cases no other known fault testing method would detect. The test bench used is a chain of buffers where the differential inputs of each gate are taken from the differential outputs of a preceding gate. It is of interest that in such a chain the degraded signals at the outputs of a gate can be restored after few logic stages.

Figure 5A:
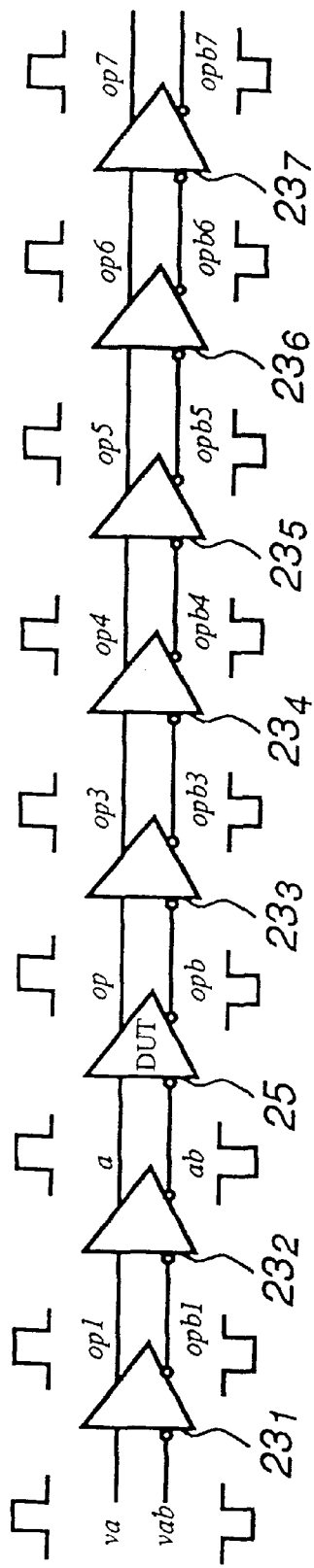
FIG. 5A is a block diagram showing a chain of eight buffers including a fault-free DUT (device under test)
Figure 5B:
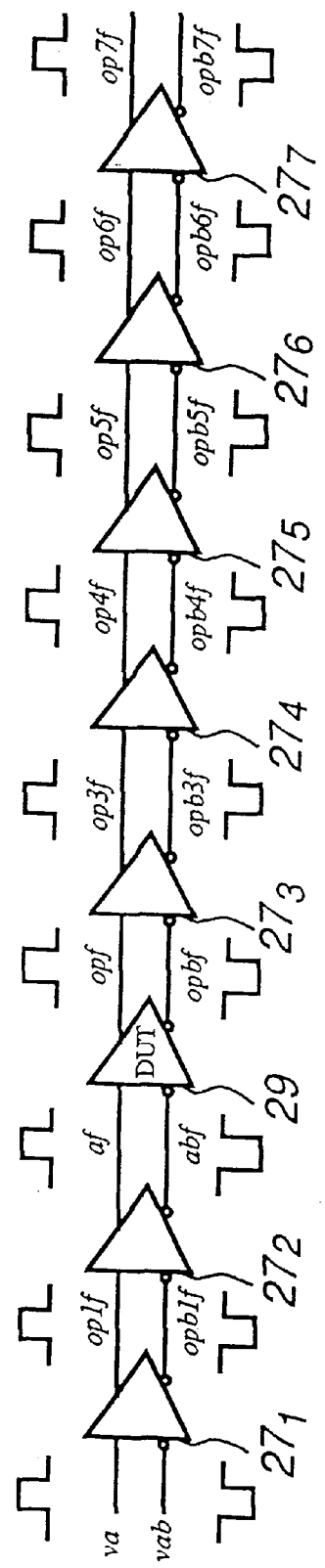
FIG. 5B is a block diagram showing a chain of eight buffers including a DUT with transistor pipe.

As a typical case of that phenomenon, the fault masking problems associated with the collector-emitter (C-E) pipe defect of the current source transistor 19 on a standard CML buffer shown in FIG. 1A are considered. FIGS. 5A and 5B show test circuits, each of them including a chain of 8 buffers. In FIG. 5A, the test circuit includes a chain of buffers $23_1$–$23_7$ and a device under test (DUT) 25 which contains no defect. In FIG. 5B, the test circuit includes a chain of buffers $27_1$–$27_7$ and a DUT 29 which contains the defect.

Figure 6:
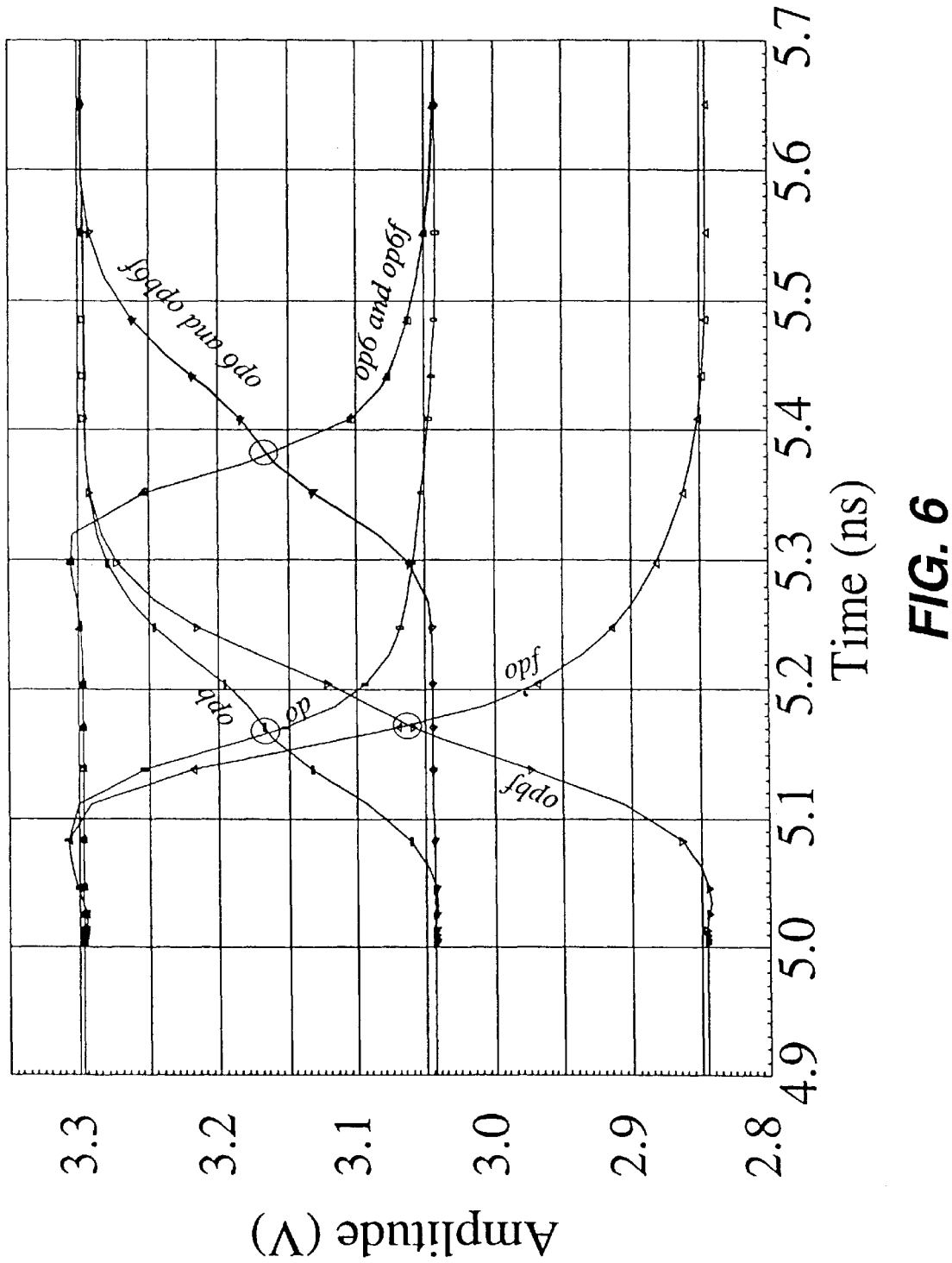
FIG. 6 illustrates output signals of the third and sixth buffers shown in FIGS. 5A and 5B.

FIG. 6 illustrates third (outputs op and opb) and sixth (outputs op6 and opb6) outputs with a 4 kΩ pipe. They show the effect of a 4 kΩ pipe on the transistor 19 shown in FIG. 1 on the outputs of the chain. It presents the output signals of both the fault-free (FIG. 5A) and faulty (FIG. 5B) chains for buffers 25, 29, $23_6$ and $27_6$, when the input signal oscillates at a frequency of 100 MHz. At the output of the faulty gate (the buffer 29), the voltage swing has nearly doubled. But, after 4 logic gates (the buffers $27_3$–$27_6$), the degraded signal due to the pipe can be completely restored both in terms of logic levels and shape of a propagated transition.

In a first attempt to detect such a fault, its impact on gate delays is evaluated, since the usual means of testing parametric faults is to test path delays. Table 1 gives the measured propagation delays at different buffer outputs (input signal frequency: 100 MHz). These delays are measured when the output crosses 3.165 V, which is the normal crossing point of an output and its complement. This voltage reference would be representative of how ECL-type gates would convert the observed output voltage into logical values. From Table 1, it is observed that the normal gate delay is 53 ps.

crossing, whatever its value, as the time measurement point. Using that delay measurement method, the results in Table 2 predict that even at the DUT 29, the delay differences are modest.

TABLE 2

|  | vα | op1 | A | op | op3 | op4 | op5 | op6 |
|---|---|---|---|---|---|---|---|---|
| $\tau_{FF}$[a] (ps) | 0 | 56 | 110 | 163 | 216 | 269 | 321 | 375 |
| delay$_{FF}$ (ps) | — | 56 | 54 | 53 | 53 | 53 | 52 | 54 |
| $\tau_{Pipe}$ (ps) | 0 | 56 | 114 | 170 | 217 | 270 | 323 | 376 |
| Delay$_{Pipe}$ (ps) | — | 56 | 58 | 57 | 48 | 53 | 53 | 53 |
| $\Delta\tau_d$ (ps) | — | 0 | 4 | 7 | 1 | 1 | 2 | 1 |
| $\Delta\%$[c] | — | 0 | 7 | 13 | 2 | 2 | 4 | 2 |

Figure 7:
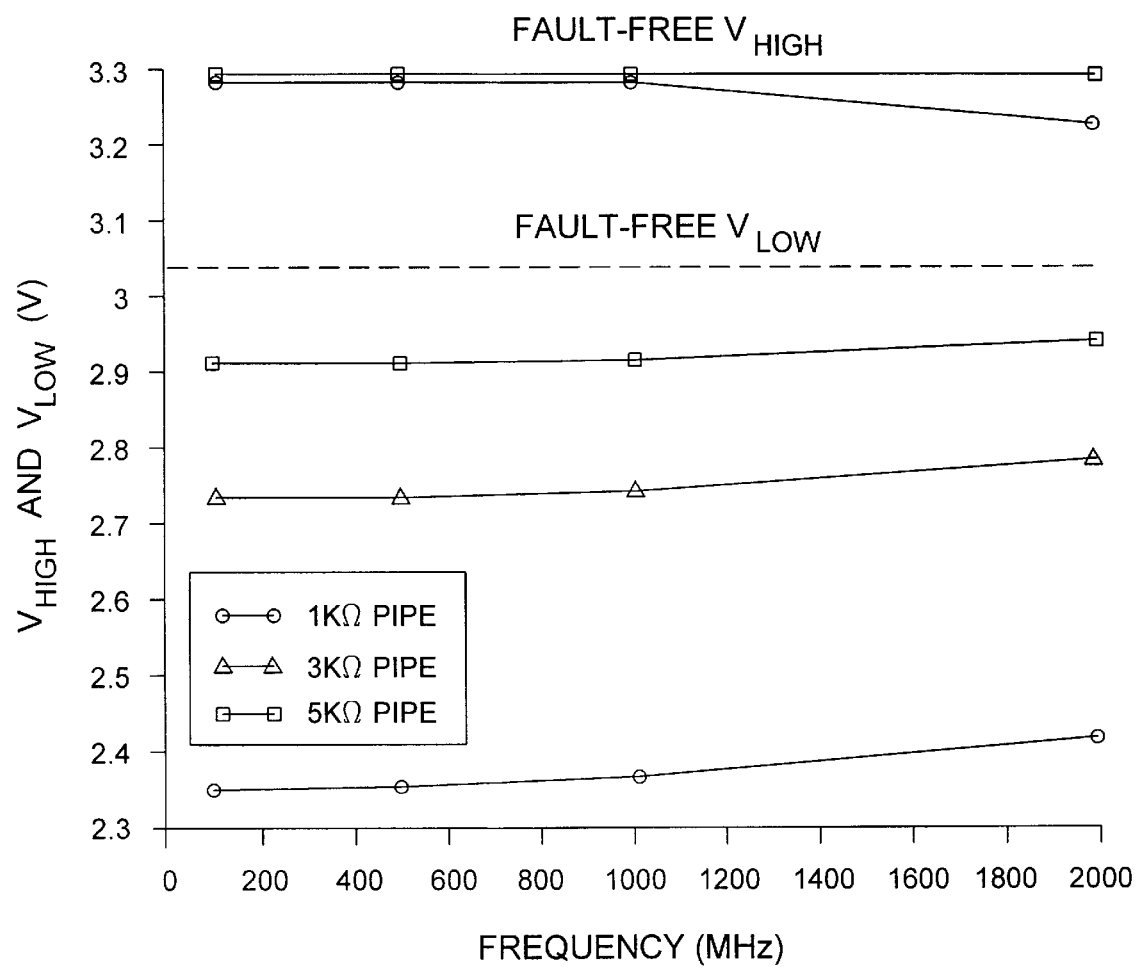
FIG. 7 illustrates frequency vs. high and low voltages in different pipe values.

[a]$\tau_{FF}$: fault free
[b]$\tau_{Pipe}$: Q3 of DUTf with a 4 KΩ C-E pipe
[c]$\Delta\tau_d$ compared to the gate's delay Coming back to FIG. 6, it has been already noticed that the main observable impact of same defects is an increase of the voltage swing. That swing is characterized over a wide range of pipe values and stimulation signal frequencies, and the corresponding output swings are shown as high and low voltages $V_{high}$ and $V_{low}$ in FIG. 7. It should be noted that as the pipe values get large, the levels come closer to their defect free values and this parametric disturbance becomes almost undetectable. The excessive amplitude of the low excursion also decreases with increasing frequency.

V. Amplitude Testing

This section proposes the techniques developed for testing abnormal amplitude excursions. In order to detect excessive swings, a DFT technique has been developed. This technique uses built-in detectors implemented at the output of each gate to convert the degraded signals into a logic value that reflects the presence of a fault. Two types of implementations have been proposed and then improved for a better stability.

V-1. First Embodiment

Figure 8:
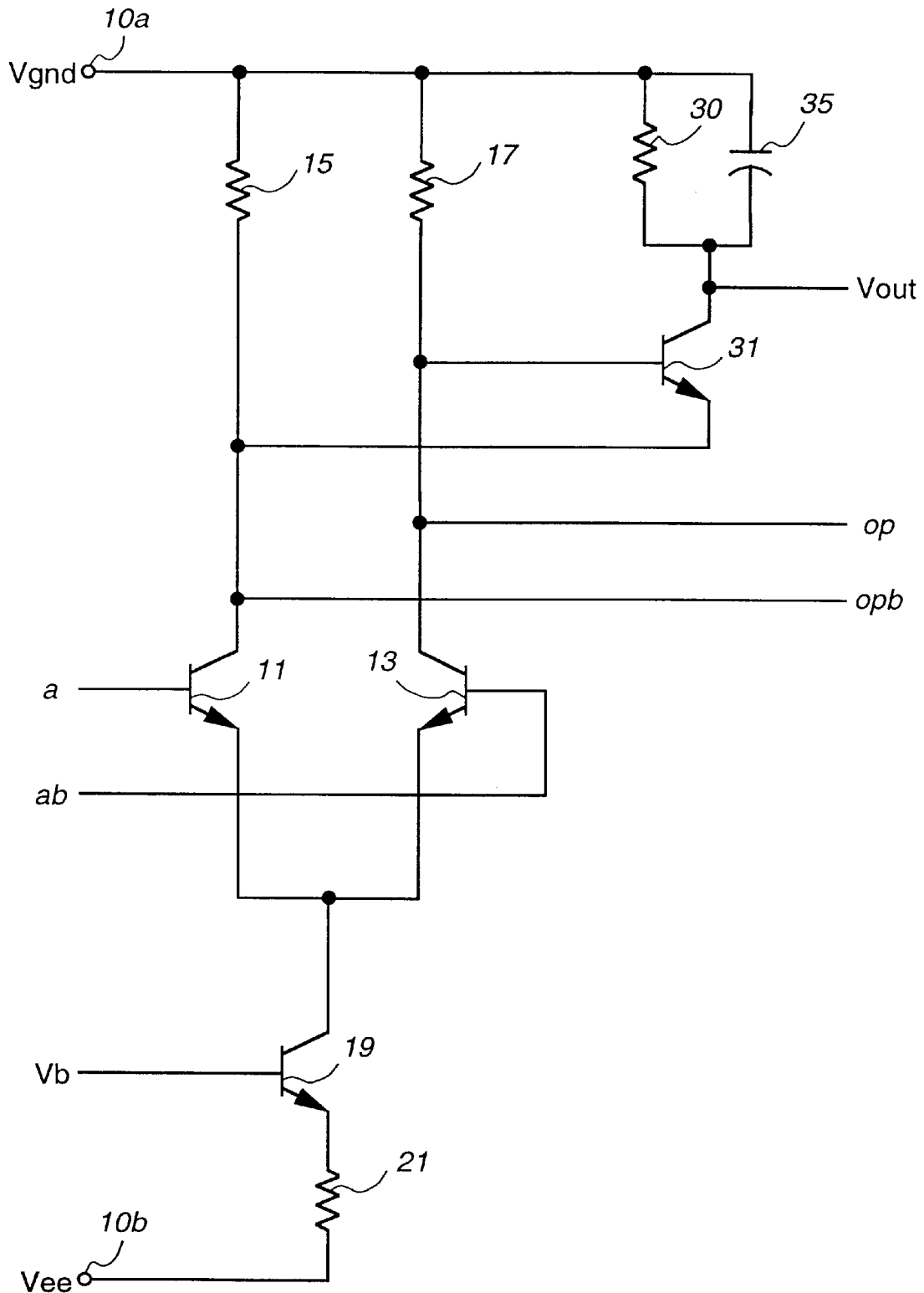
FIG. 8 is a circuit diagram of a voltage excursion detection integrated circuit according to an embodiment of the present invention.

FIG. 8 shows a voltage excursion detection integrated circuit according to a first embodiment of the present invention, which includes a basic data buffer in CML circuits connected to high and low operating voltage terminals 10a and 10b. The buffer includes a differential amplifier having transistors 11 and 13 and collector resistors 15 and 17 and also a current circuit having a transistor 19 and an emitter

TABLE 1

|  | vα | vαβ | op1 | op1β | α | Aβ | op | opβ | op3 | opβ3 | op4 | opβ4 | op5 | opβ5 | op6 | opβ6 |
|---|---|---|---|---|---|---|---|---|---|---|---|---|---|---|---|---|
| FF (ps)[a] | 0 | 0 | 51 | 64 | 105 | 112 | 163 | 163 | 216 | 216 | 269 | 269 | 322 | 322 | 376 | 376 |
| Pipe (ps)[b] | 0 | 0 | 51 | 64 | 113 | 115 | 147 | 221 | 219 | 199 | 269 | 272 | 324 | 322 | 376 | 377 |
| Δt (ps)[c] | 0 | 0 | 0 | 0 | 8 | 3 | −16 | 58 | 3 | −17 | 0 | 3 | 2 | 0 | 0 | 1 |

[a]FF: Delays measured on the fault-free chain
[b]Pipe: Delays measured on the faulty chain containing a 4 KΩ C-E pipe
[c]Δt: Difference in delays between the fault-free and faulty chains From Table 1, a delay twice the size of normal conditions can be observed on one of the outputs of the DUT (opb) while its complement (op) could be perceived as going faster than the fault-free signal. A remarkable result is the small difference in delay between the fault-free and faulty chain at the final output stage (op6 and opb6). The result is remarkable because what may have seemed to be a delay testable fault at the DUT 29, healed back to a difference which is insignificant after a few CML stages. That phenomenon is observed with several different defects in CML gates.

To better understand the healing phenomenon, the delay measurements are repeated by using the actual voltage resistor 21. The buffer's circuit is the same as that of FIG. 1A. The integrated circuit includes a built-in detector having an impedance circuit and a detection transistor circuit. The impedance circuit includes a resistor 30 (a linear element) and a capacitor 35 in a parallel load network. The detection transistor circuit includes a transistor 31.

The built-in detector is connected to outputs op and opb of each circuit cell, as shown in FIG. 8. Based on circuit simulations, it is found that this detector detects pipe defects with values up to 3 kΩ or more on the transistor 19. Indeed, the maximum output signal swing ($V_{high}-V_{low}$) is below 0.57 V for pipes of 3 kΩ or more, as shown earlier in FIG. 7.

The test circuit is built of a resistor 30, a transistor 33 and a capacitor 35. Whenever the output opb goes lower than the output op by more than 0.57 V, a current flows through the transistor 31 (from collector to emitter) sinking current from the resistor 30. This current builds a voltage difference between the diode's nodes, lowering output voltage Vout provided from the collector of the transistor 31. The output voltage Vout is a fault detection voltage. To help stabilize the output voltage Vout at a lower voltage than the supply voltage Vgnd, the capacitor 35 is used. In normal conditions, the output opb does not go lower than the output op by more than 0.3 V, and thus no current flows through the transistor 31, keeping the output voltage Vout at the supply voltage Vgnd. Since the output voltage Vout is lowered only when an amplitude fault is present, the signal can be compared to a reference voltage with a standard buffer (working as a comparator), transforming the degraded signal into a logic signal.

The detector output voltage is measured at different frequencies as a function of different combinations of load (resistor, capacitor) values, and of CE pipe resistance values on the transistor 19 (the current source transistor). The loads considered are diode-capacitor or resistor-capacitor combinations. As mentioned earlier, the diode is used as a non-linear resistance that offers a relatively high dynamic resistance at low currents, while offering a low dynamic resistance at high currents.

V-2. Second Embodiment

Figure 9:
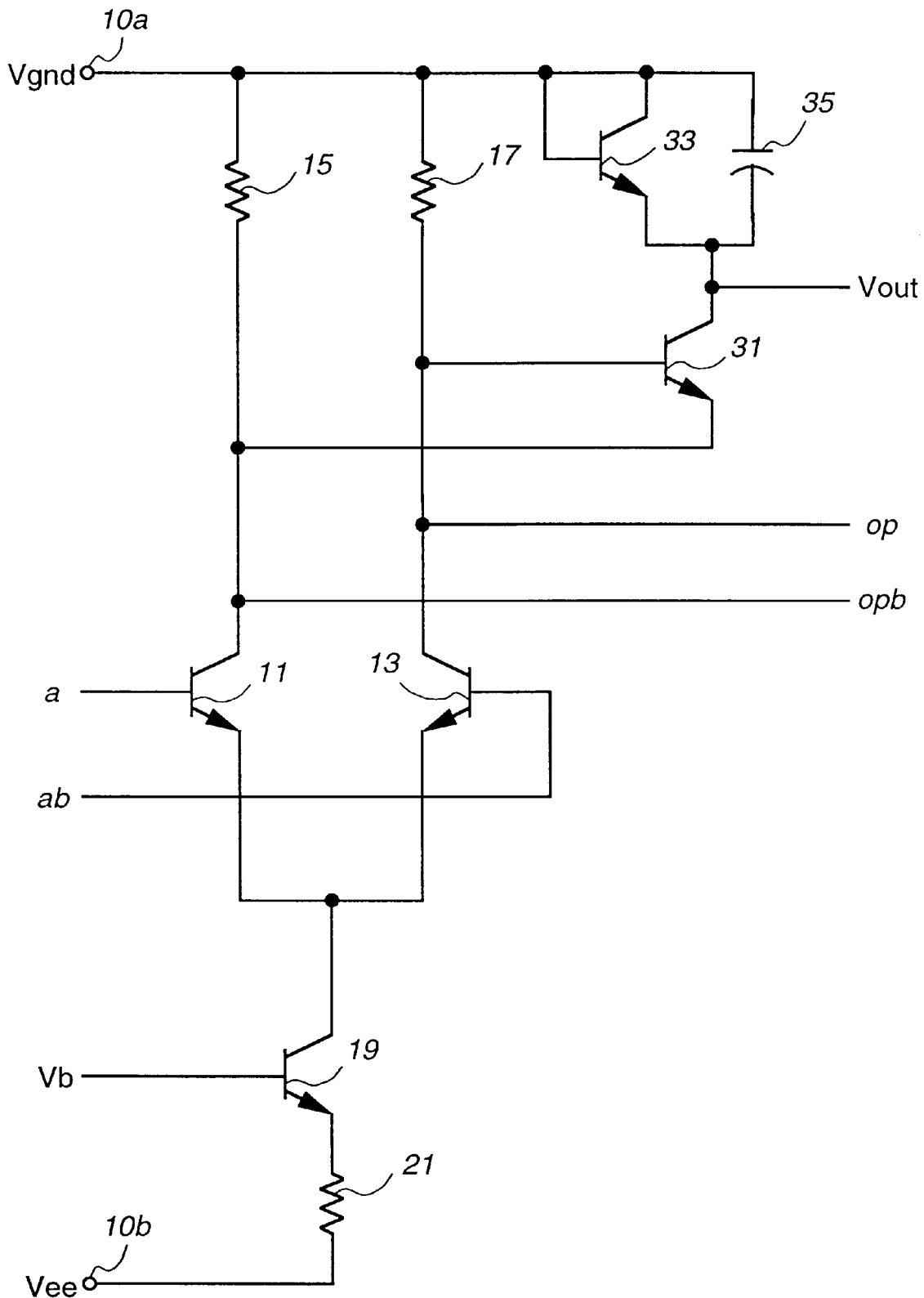
FIG. 9 is a circuit diagram of a voltage excursion detection integrated circuit according to another embodiment of the present invention.

FIG. 9 shows a voltage excursion detection integrated circuit according to a second embodiment of the present invention, which includes a basic data buffer in CML circuits connected to high and low operating voltage terminals 10a and 10b. The buffer includes a differential amplifier having the same circuit as that of FIG. 1A. The integrated circuit includes a built-in detector having an impedance circuit and a detection transistor circuit. The impedance circuit includes a diode-connected transistor 33 and a capacitor 35 in the parallel load network. The detection transistor circuit includes a transistor 31.

The built-in detector is connected to outputs op and opb of each circuit cell, as shown in FIG. 9. Based on circuit simulations, it is found that this detector does not detect pipe defects with values of 3 kΩ or more on the transistor 19. Indeed, the maximum output signal swing ($V_{high}-V_{low}$) is below 0.57 V for pipes of 3 kΩ or more, as shown earlier in FIG. 7.

The actual test circuit is built of transistors 31 and 33 as well as capacitor 35. Whenever the output opb goes lower than the output op by more than 0.57 V, a current flows through the transistor 31 (from collector to emitter) sinking current from the transistor 33, connected as a diode, which acts as a non-linear resistor. This current builds a voltage difference between the diode's nodes, lowering output voltage Vout provided from the collector of the transistor 31. The output voltage Vout is a fault detection voltage. To help stabilize the output voltage Vout at a lower voltage than the supply voltage Vgnd, a capacitor 35 is used. In normal conditions, the output opb does not go lower than the output op by more than 0.3 V, and thus no current flows through the transistor 31, keeping the output voltage Vout at the supply voltage Vgnd. Since the output voltage Vout is lowered only when an amplitude fault is present, the signal can be compared to a reference voltage with a standard buffer (working as a comparator), transforming the degraded signal into a logic signal. The impact of such a comparator will be analyzed later (V-4. Conversion of detector output voltage to a logic value).

The detector output voltage is measured at different frequencies as a function of different combinations of load (resistor, capacitor) values, and of CE pipe resistance values on the transistor 19 (the current source transistor). The loads considered are diode-capacitor or resistor-capacitor combinations. As mentioned earlier, the diode is used as a non-linear resistance that offers a relatively high dynamic resistance at low currents, while offering a low dynamic resistance at high currents.

Figure 10:
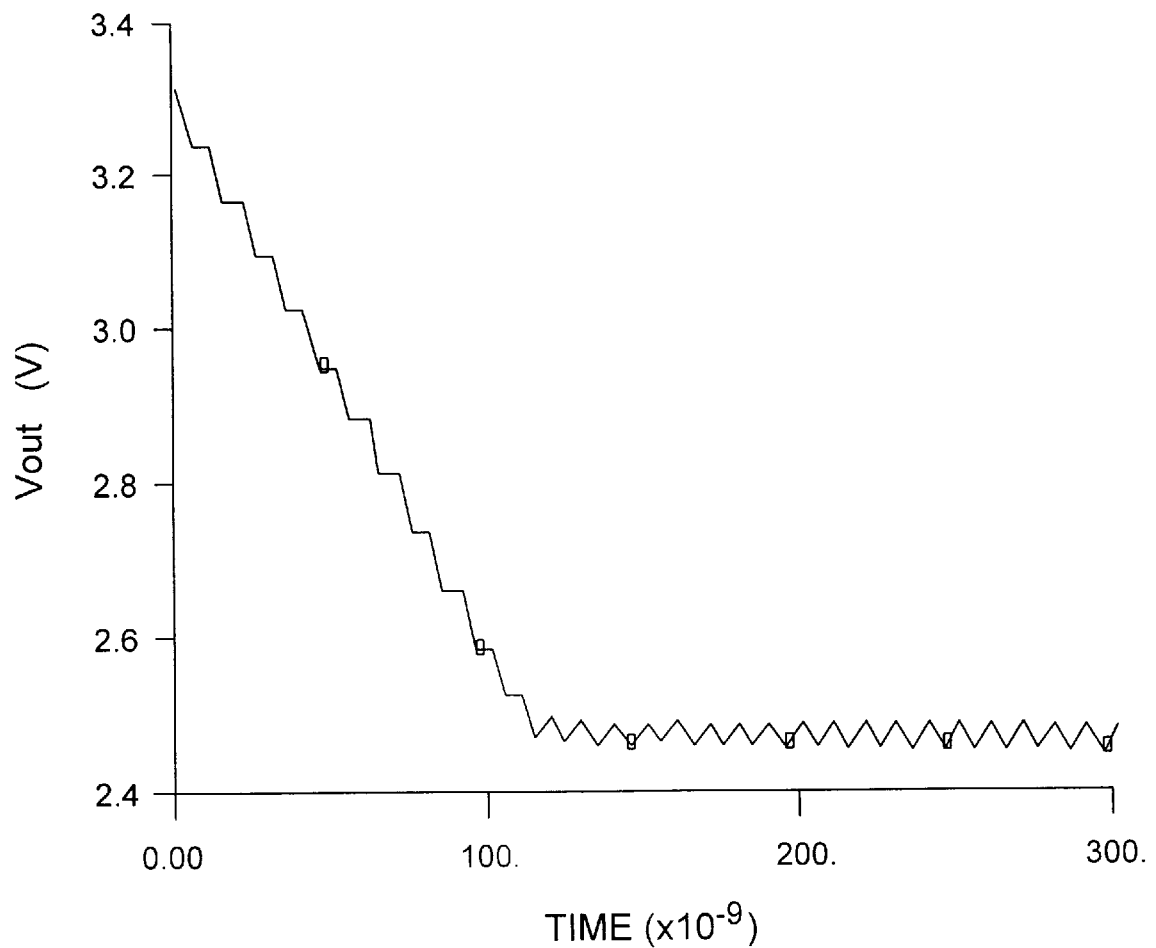
FIG. 10 illustrates response of the detector shown in FIG. 9 with a collector-emitter pipe on a transistor.
Figure 11A:
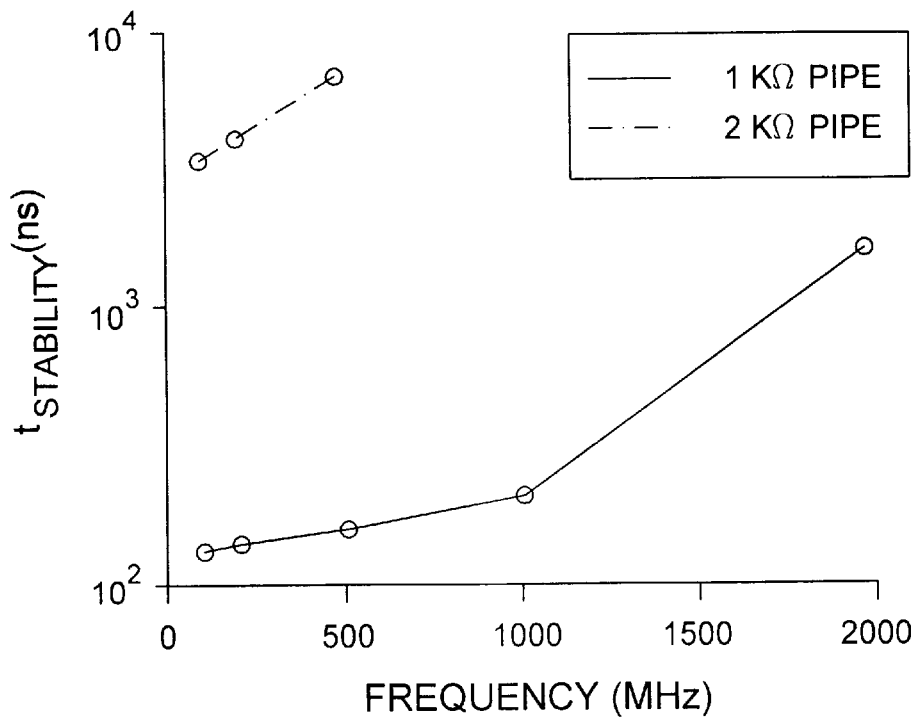
FIG. 11A illustrates frequency vs. the time to stability $t_{stability}$ with a diode-capacitor (10 pF) load.
Figure 11B:
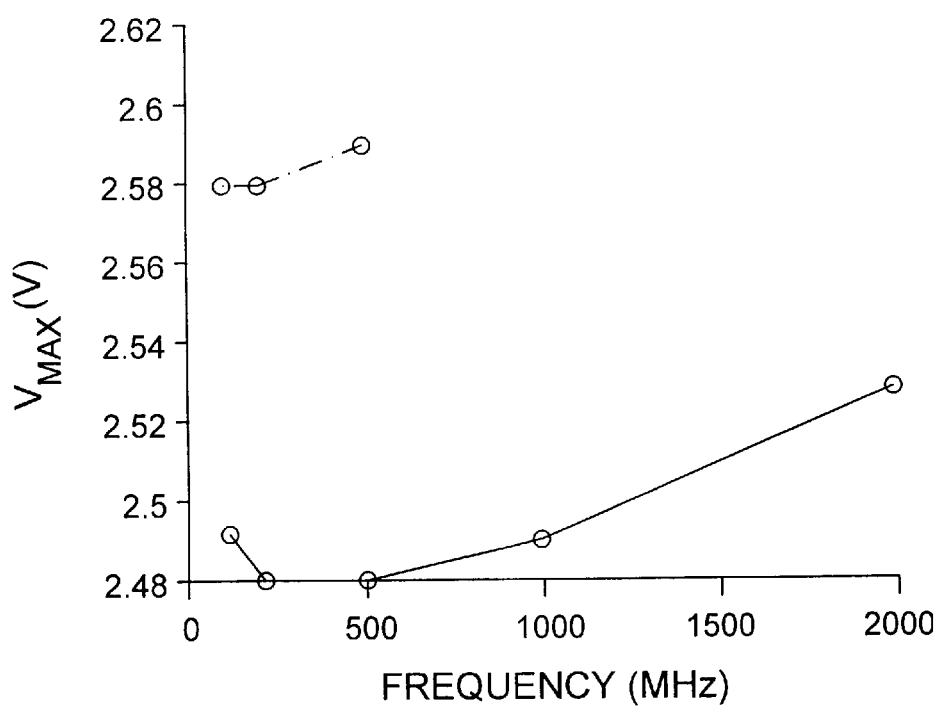
FIG. 11B illustrates frequency vs. maximum voltage $V_{max}$ with a diode-capacitor (10 pF) load.
Figure 11C:
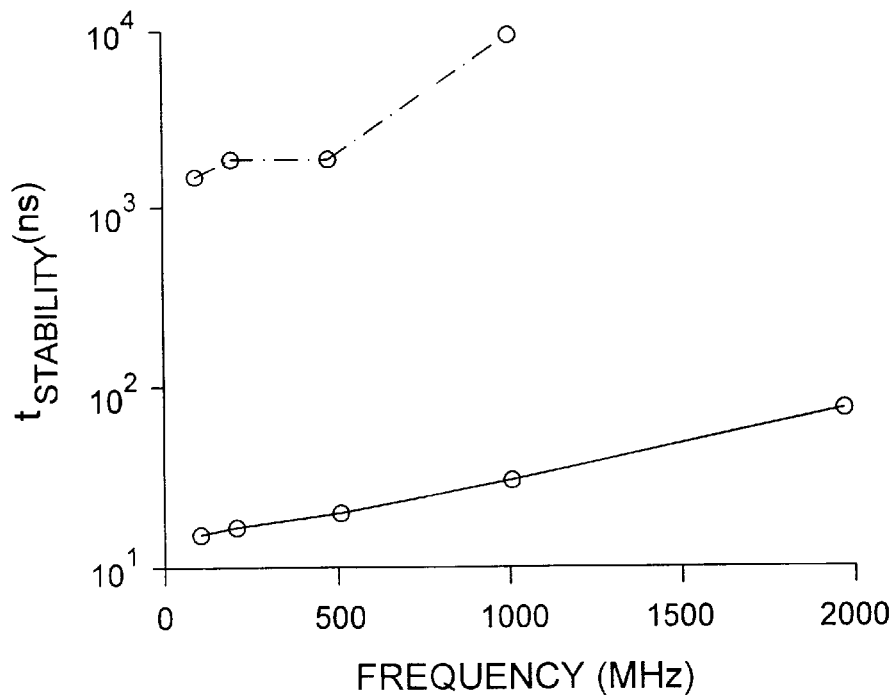
FIG. 11C illustrates frequency vs. the time to stability $t_{stability}$ with a diode-capacitor (1 pF) load.
Figure 11D:
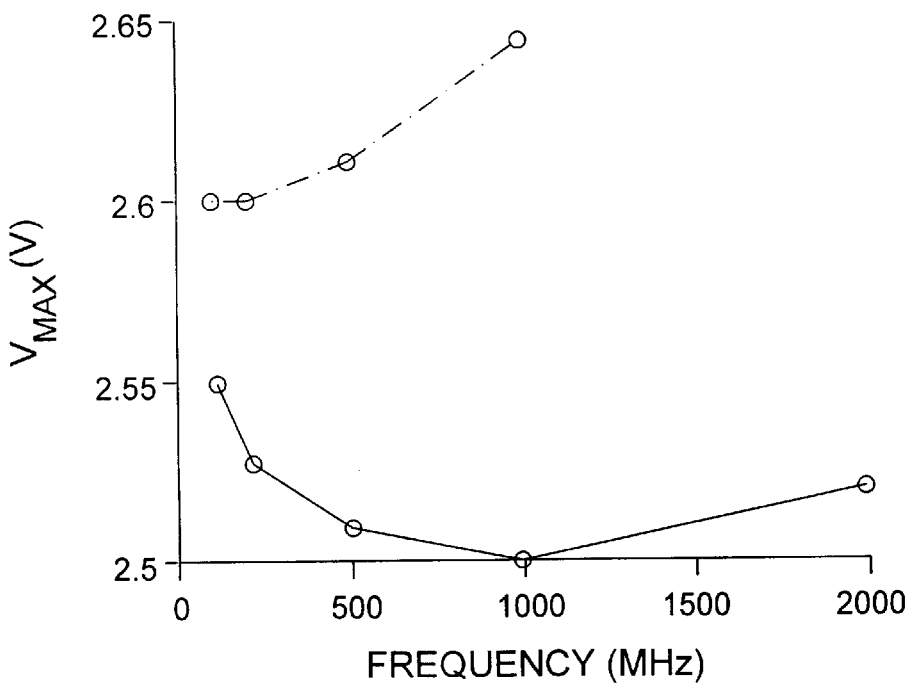
FIG. 11D illustrates frequency vs. maximum voltage $V_{max}$ with a diode-capacitor (1 pF) load.

The detector output waveforms, under the presence of a collector-emitter pipe (1 kΩ) on the transistor 19, for a diode-capacitor (10 pF) load when input signal is at 100 MHz is shown in FIG. 10. The waveform is characterized by a transient period and a relatively stable period. In that stable period, a ripple is observed with an amplitude that varies with loading and operating conditions. The time to stability ($t_{stability}$) is defined as the time where the signal reaches the first minimum value on the output voltage and $V_{max}$ as the maximum voltage of the rippling signal on the detector when stability is reached. FIGS. 11A–11D summarise the time to stability ($t_{stability}$) and the maximum voltage $V_{max}$ according to frequency, pipe value and the load capacitor value. FIGS. 11A and 11B show cases of the capacitance $C_{35}$ of the capacitor 35 is 10 pF. FIGS. 11C and 11D show the capacitance $C_{35}$ of the capacitor 35 is 1 pF.

Figure 12A:
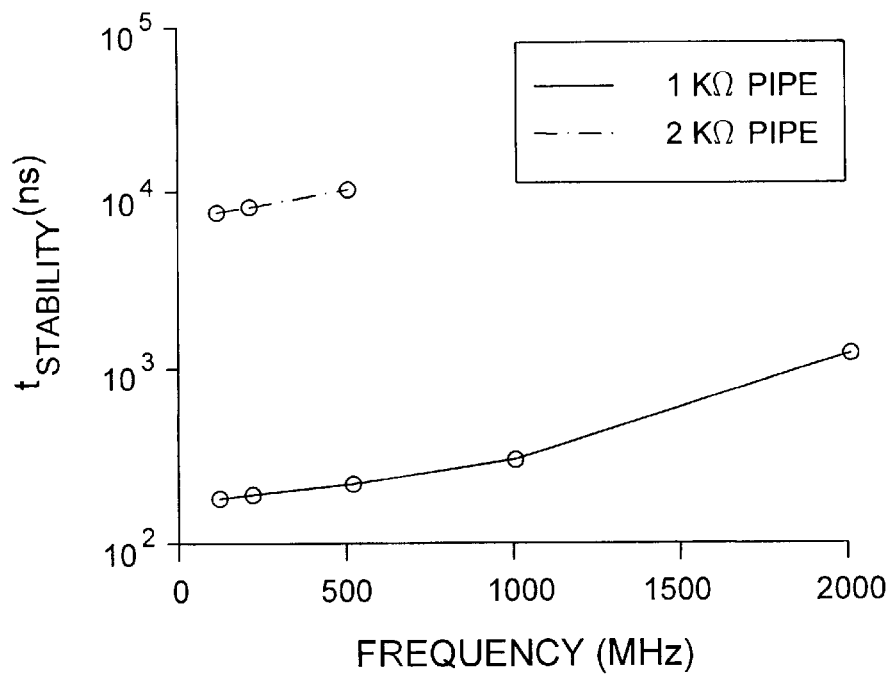
FIG. 12A illustrates frequency vs. the time to stability $t_{stability}$ with a resistor-capacitor (10 pF) load.
Figure 12B:
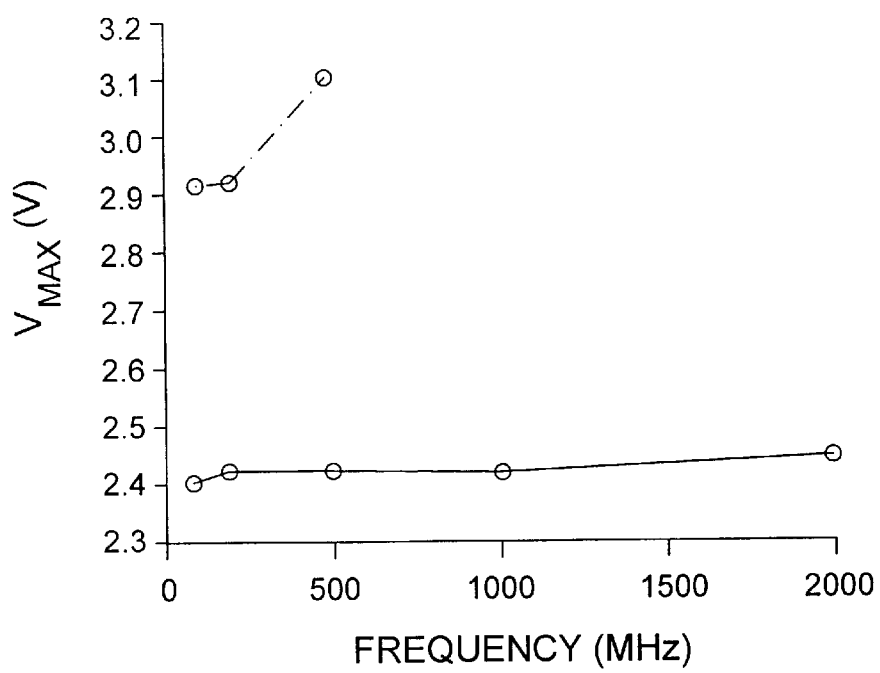
FIG. 12B illustrates frequency vs. maximum voltage $V_{max}$ with a resistor-capacitor (10 pF) load.
Figure 12C:
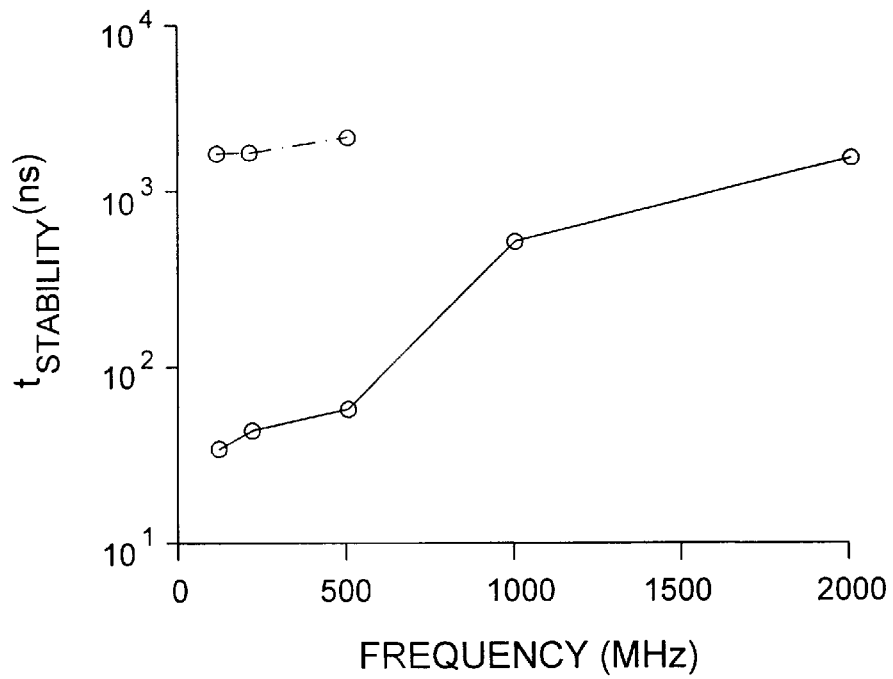
FIG. 12C illustrates frequency vs. the time to stability $t_{stability}$ with a resistor-capacitor (1 pF) load.
Figure 12D:
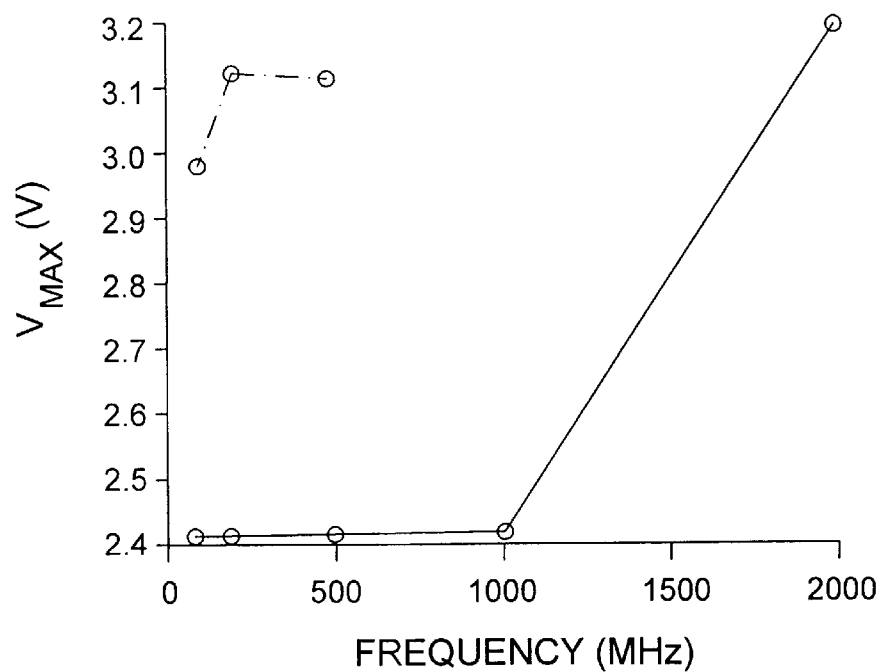
FIG. 12D illustrates frequency vs. maximum voltage $V_{max}$ with a resistor-capacitor (1 pF) load.

Good results are also obtained by replacing the transistor 33 with a 160 kΩ resistor as shown in FIGS. 12A–12D. FIGS. 12A and 12B show cases of the capacitance $C_{35}$ of the capacitor 35 is 10 pF. FIGS. 12C and 12D show the cases of the capacitance $C_{35}$ of the capacitor 35 is 1 pF. The time to obtain a stable output voltage (testability) increases significantly with frequency. This time can be much longer with a resistor-capacitor load as compared with the diode-capacitor load. Also, the maximum output voltage after stability increases with frequency, and is higher for resistor-capacitor loads than for diode-capacitor loads.

V-3. Third embodiment

Figure 13:
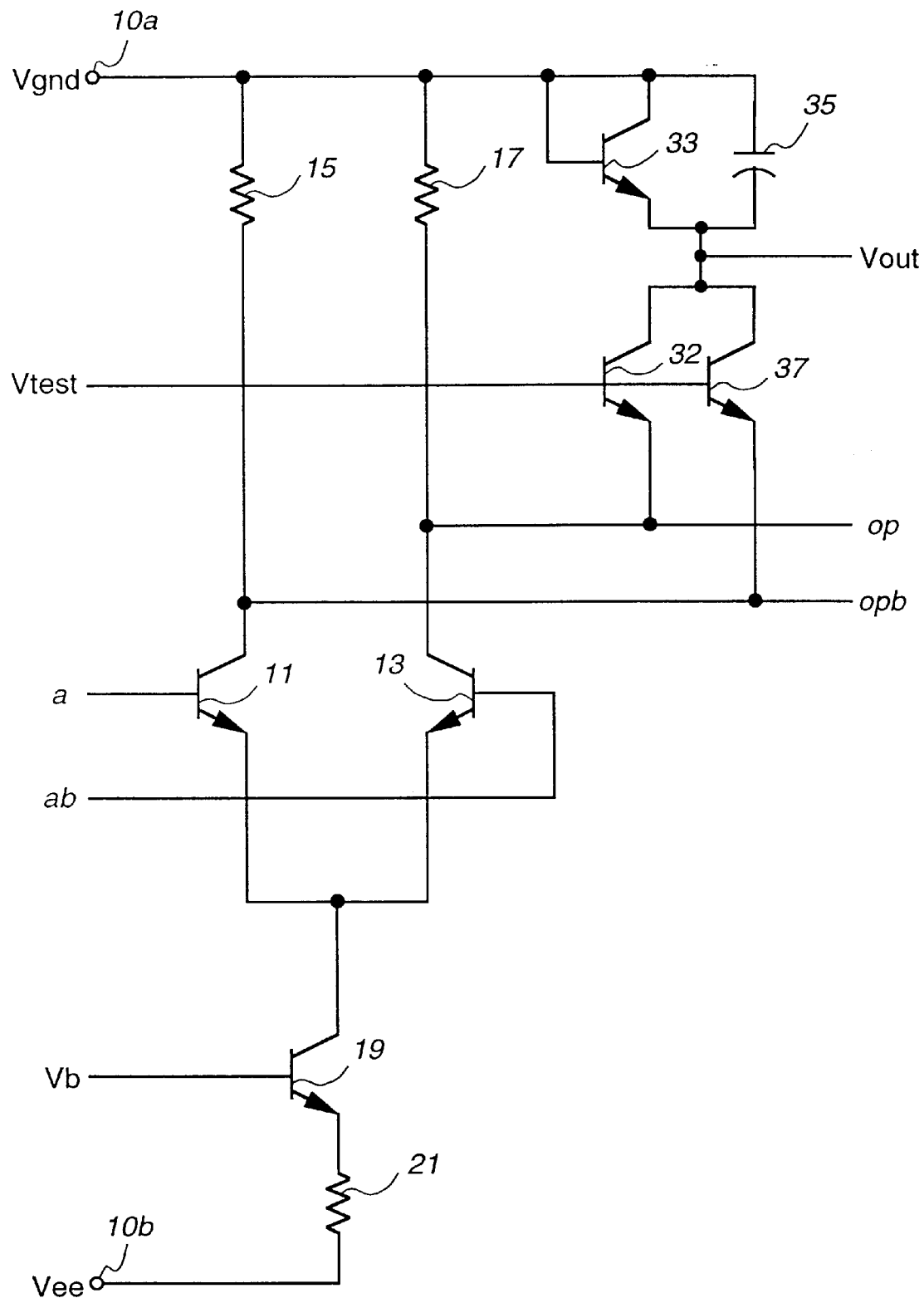
FIG. 13 is a circuit diagram of a voltage excursion detection integrated circuit according to another embodiment of the present invention.

FIG. 13 shows a voltage excursion detection integrated circuit according to a third embodiment of the present invention, which includes a basic data buffer in CML circuits connected to high and low operating voltage terminals 10a and 10b. The buffer includes a differential amplifier having the same circuit as that of FIG. 1A. The integrated circuit shown in FIG. 13 includes a built-in detector which detects an excessive swing in the cases with CE pipe defects on the transistor 19 of 3 kΩ values or more. In the built-in detector, an additional variable supply voltage (for test mode) is applied to the base of transistors 32 and 37 to increase the base-emitter bias voltage $V_{BE}$ of the detectors. With this change, the detector does not only check for excessive swings, but for all output signals going under the normal low level voltage.

In FIG. 13, pin test voltage Vtest is added and is set to the supply voltage Vgnd in normal mode and set to a higher voltage in test mode. Raising the test voltage Vtest in test mode helps transistors 32 and 37 reach a sufficient forward bias when signals op or opb have an abnormal transient voltage value, lower than the acceptable low level. If a fault leads to an abnormal swing at a gate output, the transistors 32 or 37 will conduct enough to pull down the voltage on the diode-capacitor load. If the voltage values on the outputs op and opb remain in an acceptable interval, the transistors 32 and 37 will not conduct, leaving the output voltage Vout at the supply voltage Vgnd.

Figure 14A:
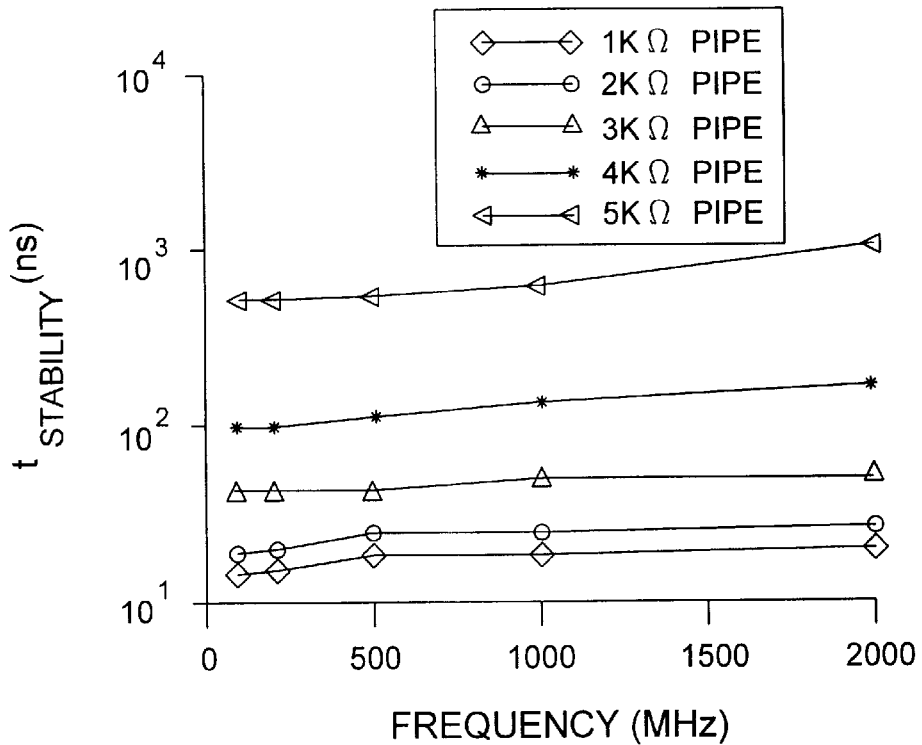
FIG. 14A illustrates frequency vs. the time to stability $t_{stability}$ of the detector shown in FIG. 13 with a load capacitor of 10 pF.
Figure 14B:
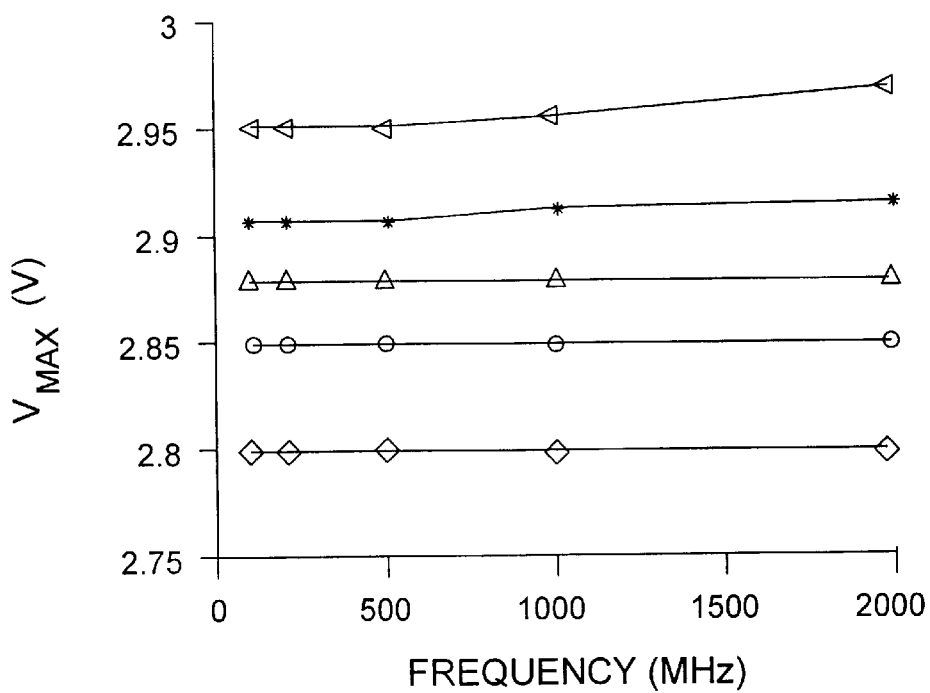
FIG. 14B illustrates frequency vs. maximum voltage $V_{max}$ of the detector shown in FIG. 13 with a load capacitor of 10 pF.
Figure 14C:
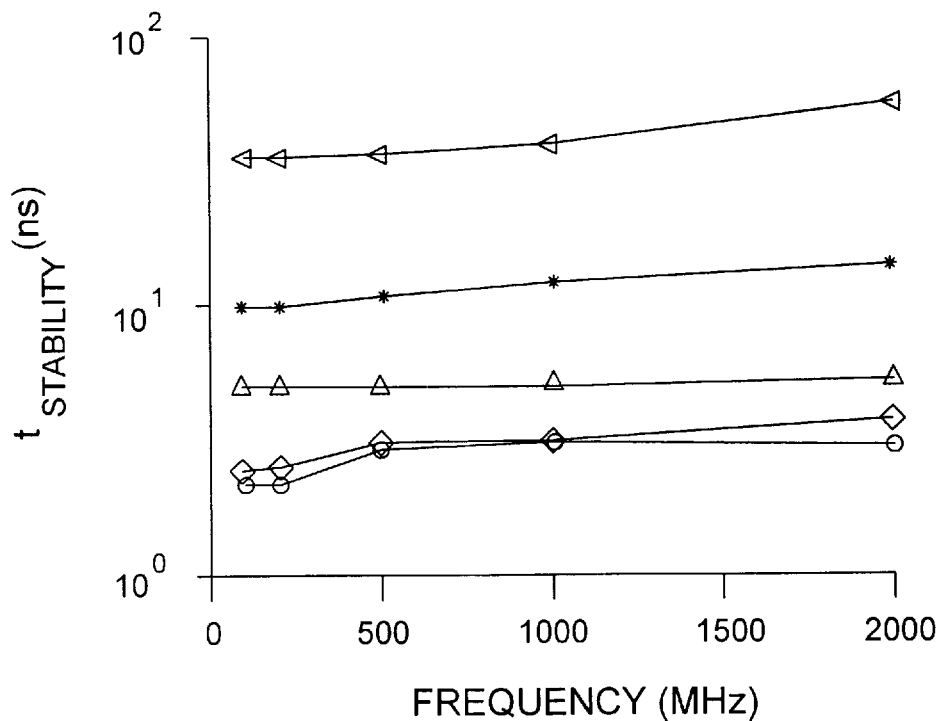
FIG. 14C illustrates frequency vs. the time to stability $t_{stability}$ of the detector shown in FIG. 13 with a load capacitor of 1 pF.
Figure 14D:
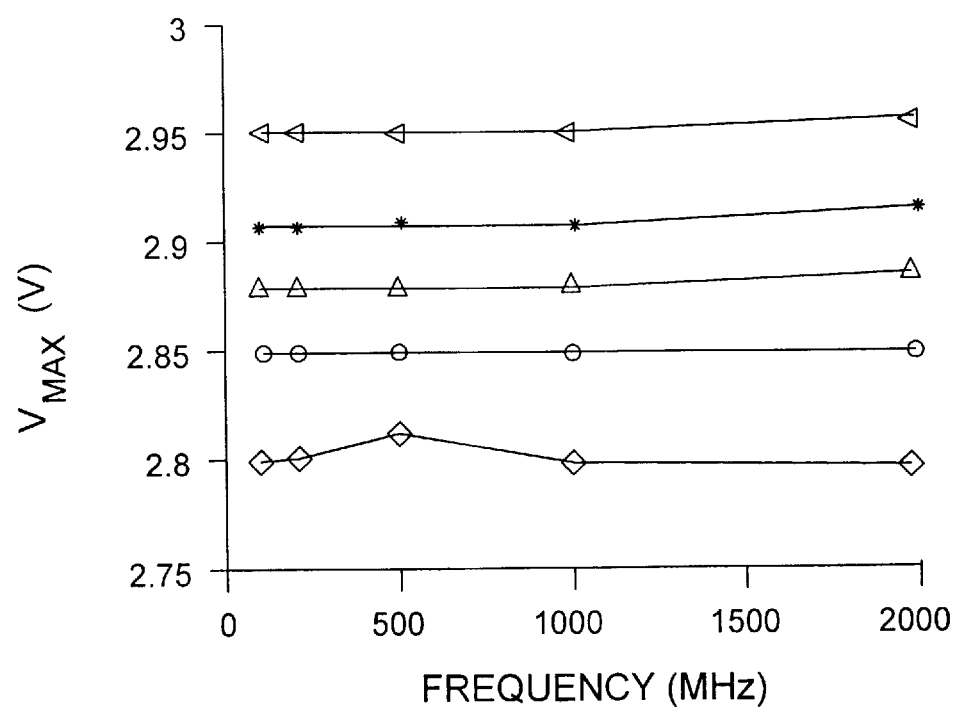
FIG. 14D illustrates frequency vs. maximum voltage $V_{max}$ of the detector shown in FIG. 13 with a load capacitor of 1 pF.

Experiments similar to those conducted with the detector shown in FIG. 8 are performed with the detector shown in FIG. 13. Depending on the transistors turn-on characteristics, it is beneficial to adjust the test voltage Vtest. A 3.7 V Vtest value is found to be an excellent compromise for an offset voltage $V_{BE}$=900 mV technology. The results are reported in FIGS. 14A–14D. FIGS. 14A and 14B show cases of the capacitance $C_{35}$ of the capacitor 35 is 10 pF. FIGS. 14C and 14D show cases of the capacitance $C_{35}$ of the capacitor 35 is 1 pF.

These results show that the detectable pipe resistance value increases up to 5 kΩ, while time to stability is much shorter than in the detector shown in 8. However, the maximum output voltage values after stability are higher than those obtained with the detector shown in FIG. 8, although the sensitivity to pipe value is relatively small.

V-4. Conversion of detector output voltage to a logic value

While the two diode-capacitor detectors shown in FIGS. 8 and 13 are quite efficient, their use unravels a common challenge: in the fault-free voltage range, they both exhibit a very high output impedance. This is challenging because bipolar comparators can have large input impedance, but this impedance is not as large as one may wish in the present case. Indeed, a CML buffer input always sinks some current from the incoming signal, whatever its logic value, and this current is somewhat larger when the input signal is a logic 1. For example, using the detector shown in FIG. 13 if the cell being tested is fault-free, the transistors 32 and 37 are open and the output voltage Vout should be kept at the supply voltage Vgnd by the load circuit. But since a buffer input sinking current is not negligible, the load diode (the transistor 33) would be forced to supply that current, creating a voltage drop that lowers the output voltage Vout. In the circuits used, the buffer input current is large enough to pull down the output voltage Vout at a value comparable to that observed with a faulty circuit.

Figure 15:
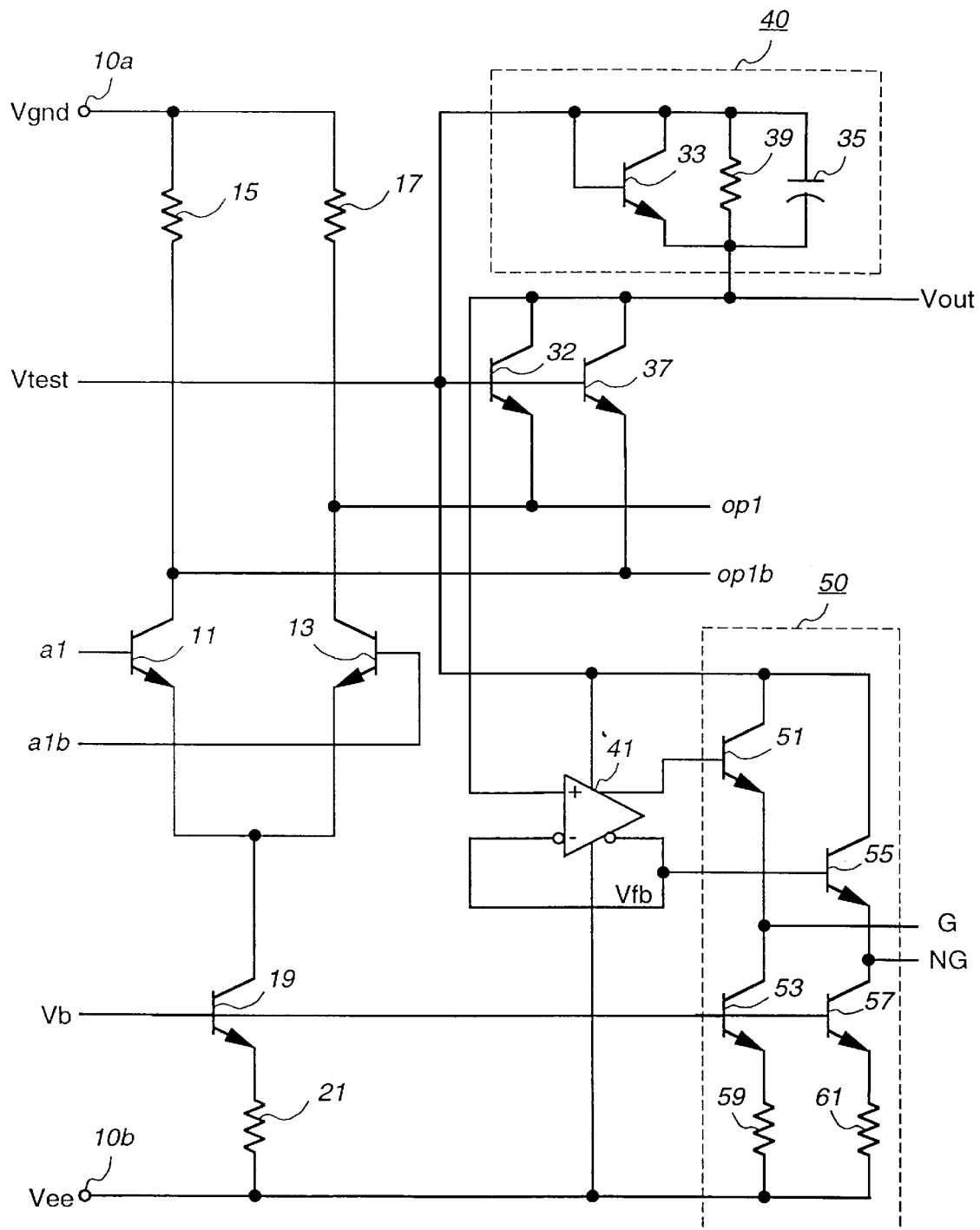
FIG. 15 is a circuit diagram of a voltage excursion detection integrated circuit according to another embodiment of the present invention.

To overcome this challenge, a viable solution is proposed as seen in FIG. 15. FIG. 15 shows a voltage excursion detection integrated circuit according to a fourth embodiment of the present invention, which includes a basic data buffer in CML circuits connected to high and low operating voltage terminals 10a and 10b. The buffer includes a differential amplifier having the same circuit as that of FIG. 1A. In FIG. 15, the connection of a load circuit 40 is pulled up to the test voltage Vtest in order to let it supply the average input bias current required by a comparator 41, while keeping a high enough quiescent value on the output voltage Vout. Also, in order to increase the difference between the output voltage Vout in the faulty and fault-free cases, a resistor 39 is added in parallel to the diode-connected transistor 33 and the capacitor 35 of the load circuit 40 to reduce the drop caused by the comparator. Since the resistor 39 has a smaller impedance than the diode-connected transistor in the small currents region, the input bias current of the comparator 41 flows mainly through the resistor 39, which reduces the voltage drop. The ideal parameters of the load circuit 40 may need to be adjusted as a function of the cells speed/power combination which is determined by the gate current source. Analysis shows that a 40 kΩ resistor value is a good choice when considering detection of 5 kΩ pipes and lower on the transistor 19.

To decide if the output voltage Vout represents a good or a bad circuit, the comparator 41 needs a voltage reference. Taking a fixed reference value centred between the expected output voltage Vout value for a fault-free circuit and for a circuit with a 5 kΩ pipe on the transistor 19 is a good choice. However, even though the difference between those two values is close to a normal swing, as shown later on in FIGS. 18 and 19, the reference voltage value suggested would then yield a maximum of half a normal noise margin on the inputs of the comparator 41 in the fault-free case. Thus, the standard noise margin would be recovered only after a few gates. The proposed solution is composed of two modifications, which are already shown in FIG. 15. The first is to connect the comparator supply to the test voltage Vtest, in order for its outputs to be compatible for a comparison with the output voltage Vout. The second modification is to use a feedback on the comparator 41. Note that Vfb in FIG. 15 is not only the complementary output of the detection amplifier, but is also the feedback voltage (complementary input) to which the output voltage Vout is compared. This increases the noise margin and provides a sharper switching due to the positive feedback it introduces. Finally, to get back down to standard CML voltage levels, a level-shifter (buffer) 50 including emitter follower transistors 51, 53, 55 and 57 and resistors 59 and 61 is used. A non-inverting output of the comparator 41 is fed to the base of the buffer transistor 51. The inverting output of the comparator 41 is fed to the base of the other buffer transistor 55. Good and not good test results G and NG are provided from the emitter followers.

Figure 16:
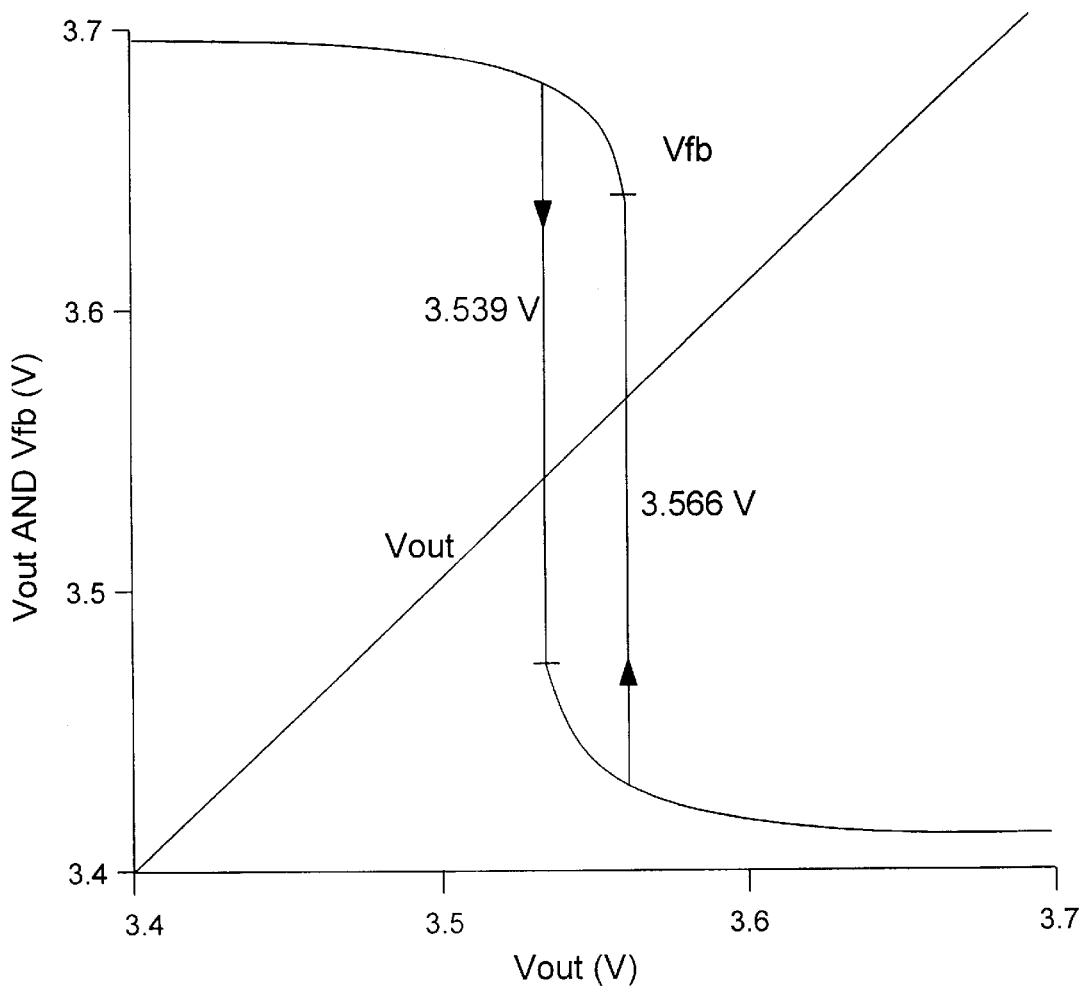
FIG. 16 illustrates hysteresis effect on a comparator included in the detector shown in FIG. 15.

Excessive positive feedback could be harmful if it leads the buffer to deadlock in the defective state during some transitions, even though the device under test is good. FIG. 16 characterizes the hysteresis due to the introduced positive feedback and confirms that a fault free gate will never be wrongly declared defective. With the current design, a defective gate yielding the output voltage Vout of 3.54 V in the test mode is guaranteed to be detected as a fault, whereas a gate with the output voltage Vout larger than 3.57 V would be treated as fault free.

V-5. Load sharing

Figure 17:
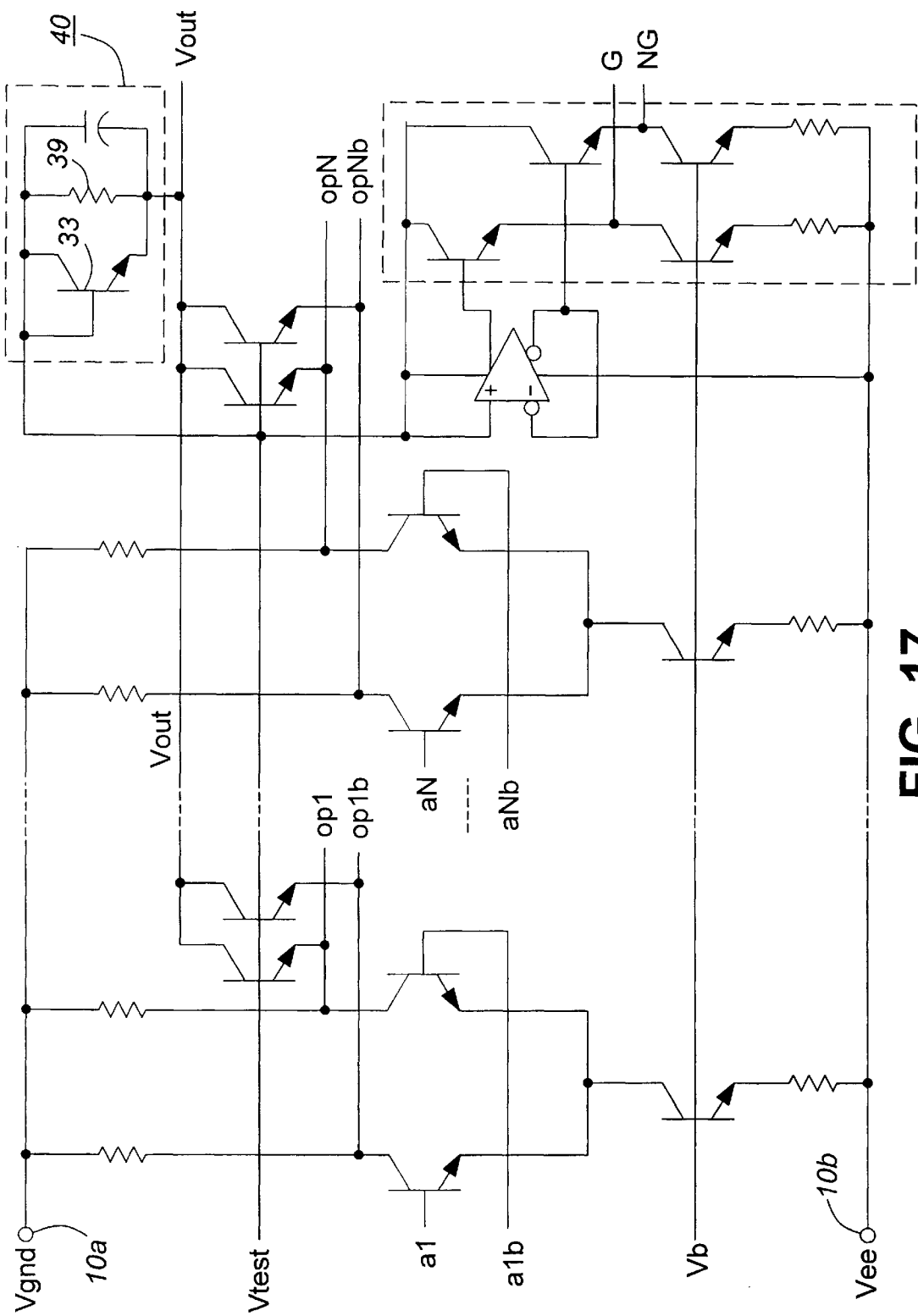
FIG. 17 is a circuit diagram of a voltage excursion detection integrated circuit according to another embodiment of the present invention.

In order to reduce the cost of the proposed method, part of the built-in detectors can be shared, namely the load circuit as well as the comparator as shown in FIG. 17. FIG. 17 shows a voltage excursion detection integrated circuit according to a fifth embodiment of the present invention, which includes a basic data buffer in CML circuits connected to high and low operating voltage terminals 10a and 10b. The buffer includes a differential amplifier having the same circuit as that of FIG. 1A.

To investigate the impact of sharing the load cell and the comparator over a number of detector outputs, the built-in detectors described above are simulated with a buffer chain of variable length (N). In the proposed configuration, each pair of outputs opi and opib of buffer i are connected to two dedicated detector transistors as shown in FIG. 17.

Figure 18:
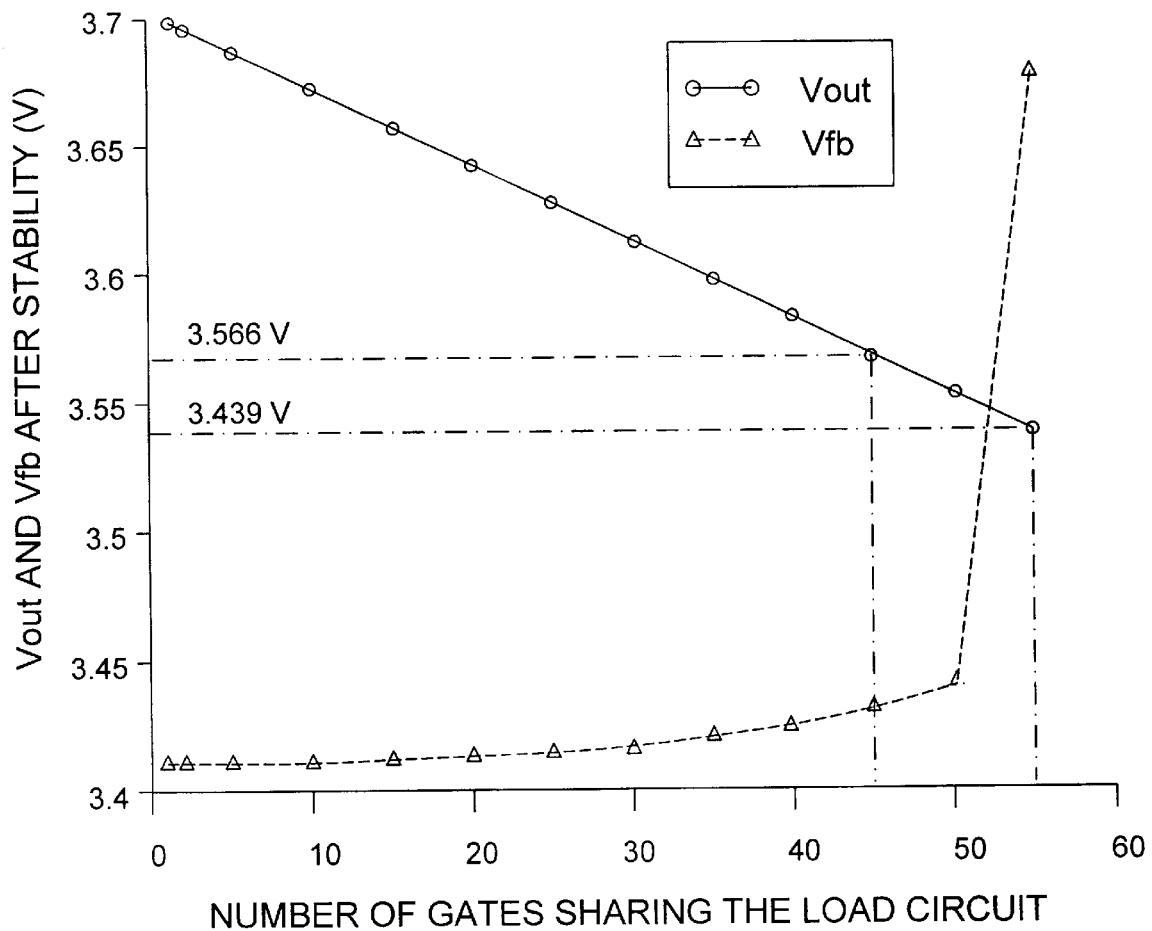
FIG. 18 shows a response of the detectors shown in FIG. 17 with a fault-free buffer.

In the first set of experiments, a number of detectors are connected together to a single shared load in a defect free circuit. The results for the fault-free circuit are shown in FIG. 18.

These results show that the output voltage Vout decreases linearly with the number of parallel cells as the leakage currents from the cells add up. This behaviour can be explained by the current-to-voltage relationship of the load circuit 40. Resistor 39 and transistor 33 have both an effect on the output voltage Vout. Independently, each current-to-voltage relationship can be expressed by:

$$I_d = I_s \left( e^{\frac{V_d}{nV_T}} - 1 \right) \text{ and } I_r = \frac{V_r}{R0} \qquad (1)$$

The expression of voltage drop for 1 detector and N detectors can be written respectively as follows:

$$V_{dl} = nV_T \ln\left(\frac{I_L}{I_s} + 1\right) \text{ and } V_{rl} = R0 \cdot I_L \quad (2)$$

$$V_{dN} = nV_T \ln\left(\frac{NI_L}{I_s} + 1\right) \text{ and } V_{rN} = R0 \cdot N \cdot I_L \quad (3)$$

And the difference in voltage between 1 detector and N detectors are given by:

$$V_{dN} - V_{dl} = \quad (4)$$

$$nV_T \ln\left[\left(\frac{NI_L}{I_s} + 1\right) / \left(\frac{I_L}{I_s} + 1\right)\right] \text{ and } V_{rN} - V_{rl} = R0 \cdot I_L(n-1)$$

where $I_L$: the leakage current of each detector
$I_d$: the current flowing in the diode-connected transistor 33
$I_s$: the saturation current of the load circuit 40
$V_r$: the voltage across the resistor 39
$I_r$: the current flowing in the resistor 39
$nV_T$: a constant at the room temperature=26 mV
R0: the resistance of the resistor 39

In the load circuit 40, if the transistor is dominant, the effects on the output voltage Vout when increasing N would be logarithmic whereas a dominant resistor would yield a linear relationship between N and the output voltage Vout. In the present situation, the resistor 39 has a 40 kΩ value which is dominant over the transistor when it has low $V_{BE}$ values. Therefore, in a fault-free circuit, where the transistor 33's $V_{BE}$ is small, the resistor 39 is dominant in the load circuit 40 and yields a linear behaviour when load sharing increases. Changing the resistance value of the resistor 39 obviously changes the slope of the curve.

The results also show that, while the feedback keeps a noise margin higher than 50% on the comparator's input, a limit exists on the number of cells that can share the same load circuit. A good criterion, to obtain a secure maximum number of buffers that can share the same load circuit, would be that the output voltage Vout exceeds the highest voltage of the hysteresis curve, which is 3.57 V. FIG. 18 shows the low and high values of the hysteresis curve transposed from FIG. 16, and according to the results, the maximum number of buffers that can share a load is 45.

Figure 19:
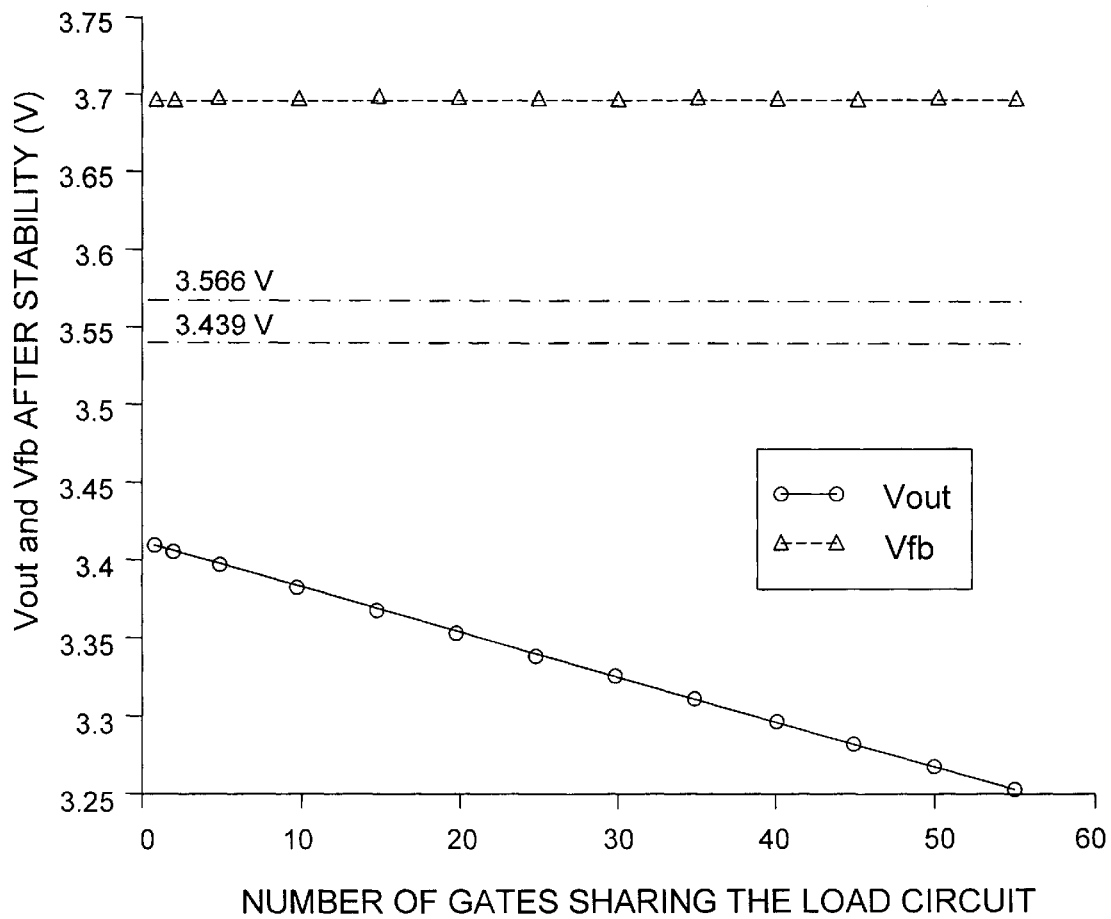
FIG. 19 shows a response of the detectors shown in FIG. 17 with one 5 kΩ pipe buffer.

FIG. 19 shows the results for a buffer chain where one buffer has a 5 kΩ C-E pipe defect on transistor 19, and the N−1 other buffers are fault-free. As in the fault-free circuit, the output voltage Vout decreases linearly with N increasing, because a 5 kΩ pipe is not strong enough to get transistor 33 in high conductance. But the pipe is strong enough to pull down the output voltage Vout significantly. Since the output voltage Vout is much lower than the low hysteresis value (3.54 V), Vfb is kept at the test voltage Vtest.

Considering the small variations of the output voltage with the number of cells, and the more than sufficient residual noise-margin that allows to distinguish the faulty and fault-free circuits, it is clear that sharing a load cell and the associated comparator by up to 45 gates (for example) is feasible.

V-6. Area Optimization

Figure 20:
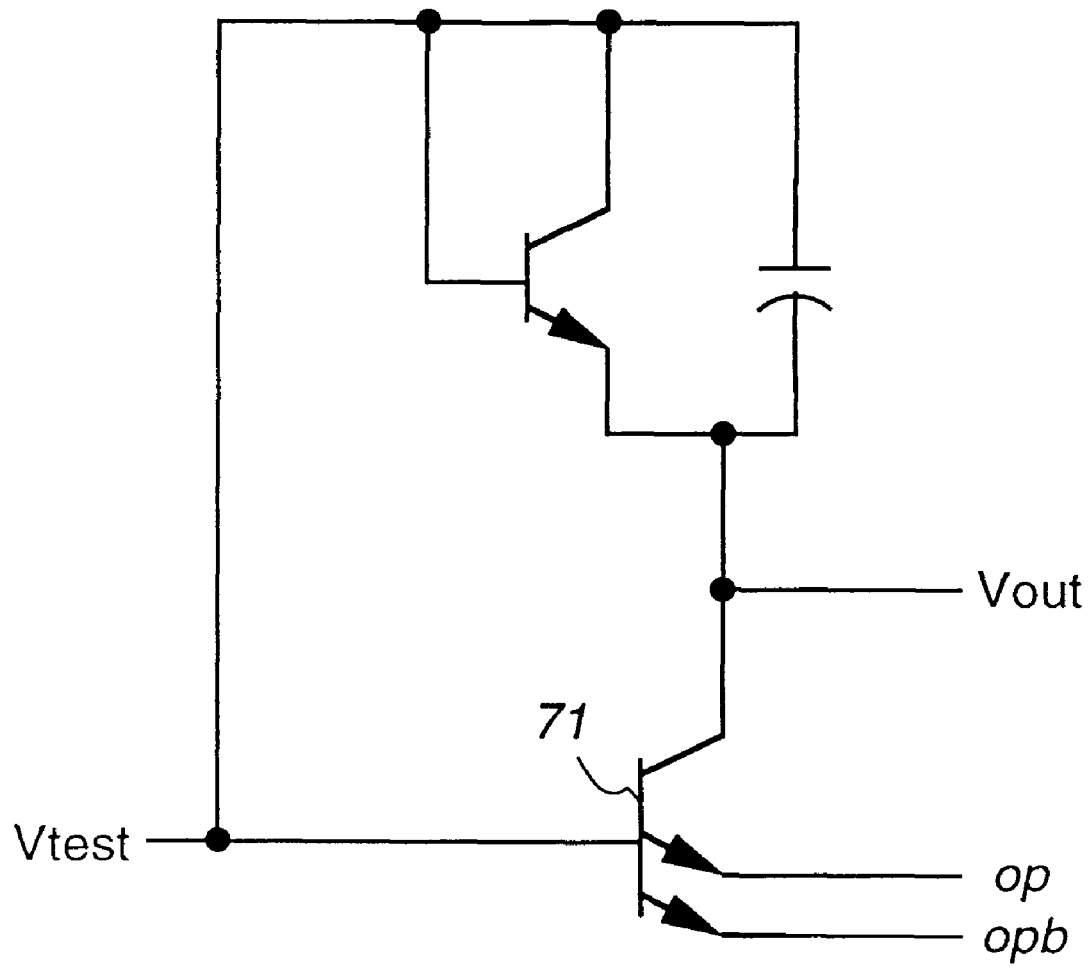
FIG. 20 shows an example of a detector including a multiple emitter transistor.

An interesting refinement to the implementation of the detectors shown in FIGS. 13 and 15 is to use multiple emitter transistors as shown in FIG. 20. Instead of using two transistors 32 and 37 of FIG. 13, the detector can be implemented by one transistor 71 with two emitters. This transistor configuration provides two inputs connected to the buffer's outputs op and opb. It allows a considerable reduction in the area overhead for circuits that use large numbers of detectors.

V-7. Testing Approach

While pipe defects in current source transistors affect both output amplitudes and are fully detectable with DC test, in some more complex gates, such as OR-gates, some defects modify the amplitude of only one output and thus, mask the fault. To detect it, the fault must be asserted by sensitizing a path through the faulty gate and make its output toggle. In this case, the fault is asserted half the time. Since the detectors pull-down resistance on the output voltage Vout when the fault is asserted is much stronger than the load circuit pull-up resistance, capacitor 45 will stabilize the output voltage Vout at a low value and the amplitude detector will be able to flag the faulty gate.

For combinational circuits, getting a path to toggle is a question of applying test vectors to sensitize it, but for sequential circuits, it is not that simple. An effective method to obtain a good toggle coverage in a sequential circuit is to stimulate it with random patterns. Measuring the toggle coverage by simulation does pose the problem of finding an initialisation sequence. However, that objective is easily accomplished with most circuits, since as presented in M. Soufi et al., "Producing Reliable Initialization and Test of Sequential Circuits with Pseudorandom Vectors", IEEE Transactions on Computers, Vol. 44, No. 10, pp. 1251–1255, October 1995, they tend to converge to a deterministic state, irrespective of the initial state, and that convergence is easily demonstrated with a single fault free simulation of relatively short length.

Proposed is a DFT technique to detect a class of parametric faults encountered in CML circuits. It consists in implementing built-in detectors at the output of each buffer gate. Instead of testing the circuits at the primary outputs, the testing is performed on all gate outputs through these built-in detectors. This method is very effective to detect degraded signals caused by classes of defects such as a collector to emitter pipe on the current source transistor. Three detector configurations have been proposed. The detector shown in FIG. 8 allows to detect pipe defects with values of less than 3 kΩ, while the detectable pipe resistance value for the detector shown in FIG. 13 increases up to 5 kΩ. The detector shown in FIG. 15 is an improvement that makes the detector more immune to noise. It is shown that a load cell can be shared by up to 45 gates (for example) and still detect an amplitude fault on one of them. A multiple emitter transistor configuration has also been proposed to reduce the number of transistors for the detectors shown in FIG. 13 and 14. Finally, a testing scheme for output amplitude faults is proposed. It consists of sensitizing paths one after the other and applying toggling input signals. For sequential circuits, random patterns are suggested to yield good toggle coverage. The proposed techniques are superior to prior art in detecting defect classes in CML circuits, without reverting to at speed test approaches.

The logic circuit may be single-ended circuits. Bipolar transistors may be inversed to opposite transistors for particular applications. The bipolar transistors may be replaced by field effect transistors.

Although particular embodiments of the present invention have been described in detail, it should be appreciated that numerous variations, modifications, and adaptations may be made without departing from the scope of the present invention as defined in the claims.

What is claimed is:

1. An integrated circuit comprising:

data output means to which first and second operating voltages are fed, the data output means comprising a first transistor circuit for providing output voltage between first and second circuit nodes thereof in response to at least one input signal;

a detector to which a third operating voltage is fed, the detector being coupled to the data output means, the detector comprising an impedance circuit and a detection circuit which is coupled to the impedance circuit, the third operating voltage being fed to the detection circuit via the impedance circuit, the detection circuit including a second transistor circuit which operates in response to the output voltage of the first transistor circuit;

the impedance circuit comprising an impedance element connected between first and second terminals of the impedance circuit, the first terminal being for receiving the third operating voltage; and the second transistor circuit being connected to third, fourth and fifth terminals of the detection circuit, the third terminal being connected to the second terminal of the impedance circuit, the fourth and fifth terminals being connected to the first and second circuit nodes of the first transistor circuit, the output being provided from the second terminal of the impedance circuit, the detector providing an output indicating an abnormal voltage excursion.

2. The integrated circuit of claim 1, wherein the impedance element comprises a capacitive circuit connected between the first and second terminals of the impedance circuit.

3. The integrated circuit of claim 2, wherein the capacitive circuit comprises a parallel circuit of a first resistance element and a capacitance element.

4. The integrated circuit of claim 3, wherein the first resistance element comprises a resistance element having linear characteristic.

5. The integrated circuit of claim 3, wherein the first resistance element comprises a resistance element having non-linear characteristic.

6. The integrated circuit of claim 3, wherein the first resistance element comprises a parallel-connected linear and non-linear resistors.

7. The integrated circuit of claim 5, wherein the non-linear resistance element comprises a diode element.

8. The integrated circuit of claim 7, wherein the diode element comprises a first transistor, the collector and base of which are connected to the first terminal, the emitter of the first transistor being connected to the second terminal of the impedance circuit.

9. The integrated circuit of claim 8, wherein the first and third operating voltages are an equal dc voltage and the second operating voltage is another dc voltage.

10. The integrated circuit of claim 9, wherein the second transistor circuit comprises a second transistor, the collector, base and emitter of which are connected to the third, fourth and fifth terminals of the detection circuit, respectively.

11. The integrated circuit of claim 9, wherein the second transistor circuit comprises third and fourth transistors and the detection circuit further comprises a sixth terminal for receiving a fourth operating voltage for testing, the collectors of the third and fourth transistors being connected to the third terminal of the detection circuit, the bases of the third and fourth transistors being connected to the sixth terminal of the detection circuit, the emitters of the third and fourth transistors being connected to the fourth and fifth terminals, respectively, the output indicating an abnormal voltage excursion being provided in response to the fourth operating voltage.

12. The integrated circuit of claim 8, wherein the first and second operating voltages are different dc voltages and the third operating voltage is a fourth operating voltage for testing.

13. The integrated circuit of claim 12, wherein the second transistor circuit comprises third and fourth transistors and the detection means further comprises a sixth terminal for receiving the fourth operating voltage, the collectors of the third and fourth transistors being connected to the third terminal, the bases of the third and fourth transistors being connected to the sixth terminal, the emitters of the third and fourth transistors being connected to the fourth and fifth terminals, respectively, the output indicating an abnormal voltage excursion being provided in response to the fourth operating voltage.

14. The integrated circuit of claim 13, wherein the first resistance element of the capacitive circuit comprises a parallel-connected linear and non-linear resistors.

15. The integrated circuit of claim 1, wherein the first transistor circuit comprises a logic circuit connected between first and second operating voltage terminals to which the first and second operating voltages are fed.

16. The integrated circuit of claim 15, wherein the logic circuit comprises a differential amplifier and a current circuit for the differential amplifier, the differential amplifier comprising fifth and sixth transistors and second and third resistance elements, the emitters of the fifth and sixth transistors being coupled, the coupled emitters being coupled to the current circuit, the second resistance element being connected between the collector of the fifth transistor and the first operating voltage terminal, the third resistance element being connected between the collector of the sixth transistor and the first operating voltage terminal, the differential amplifier providing a logic output as the output voltage from the collectors of the fifth and sixth transistors.

17. The integrated circuit of claim 16, wherein the current circuit comprises a seventh transistor for sinking current flowing in the differential amplifier's transistors.

18. The integrated circuit of claim 13, further comprising voltage level shift circuit including an emitter follower circuit for providing a test result output, in response to the output indicating an abnormal voltage excursion.

19. The integrated circuit of claim 16, wherein the logic circuit is a data buffer, the input signal being differential signals representing input data and fed to the bases of the fifth and sixth transistors, the output voltage representing output data being provided from the collectors thereof.

20. The integrated circuit of claim 16, wherein the logic circuit further comprises eighth and ninth transistors to operate as an AND gate, the emitters of the eighth and ninth transistors being coupled, the coupled emitters being coupled to the current circuit, the collector of the eighth transistor being connected to the coupled emitters of the fifth and sixth transistors, the collector of the ninth transistor being connected to the collector of the sixth transistor, the input signals being first and second input differential signals, the first input differential signals being fed to the bases of the fifth and sixth transistors, the second input differential signals being fed to the bases of the eighth and ninth transistors, the output voltage representing an AND logic output being provided from the collectors of the sixth and fifth transistors.

21. The integrated circuit of claim 16, wherein the logic circuit further comprises eighth and ninth transistors to operate as an OR gate, the emitters of the eighth and ninth transistors being coupled, the coupled emitters being coupled to the current circuit, the collector of the eighth transistor being connected to the coupled emitters of the fifth and sixth transistors, the collector of the ninth transistor being connected to the collector of the sixth transistor, the input signals being first and second input differential signals, the first input differential signals being fed to the bases of the sixth and fifth transistors, the second input differential signals being fed to the bases of the ninth and eighth transistors, the output voltage representing an OR logic output being provided from the collectors of the fifth and sixth transistors.

22. The integrated circuit of claim 6, wherein the logic circuit further comprises eighth, ninth, tenth and eleventh transistors to operate as a multiplexer, the emitters of the eighth and ninth transistors being coupled, the coupled emitters being coupled to the current circuit, the collector of the eighth transistor being connected to the coupled emitters of the fifth and sixth transistors, the collector of the ninth transistor being connected to the coupled emitters of the tenth and eleventh transistors, the collectors of the tenth and eleventh transistors being connected to the collectors of the fifth and sixth transistors, the input signals being first and second input differential signals and selection differential signals, the first input differential signals being fed to the bases of the fifth and sixth transistors, the second input differential signals being fed to the bases of the tenth and eleventh transistors, the selection differential signals being fed to the bases of the ninth and eighth transistors, the output voltage representing a multiplexed logic output being provided from the collectors of the sixth and fifth transistors.

23. The integrated circuit of claim 9, wherein the second transistor circuit comprises a multiple emitter transistor and the detection circuit further comprises a sixth terminal for receiving a fourth operating voltage for testing, the collector and base of the multiple emitter transistor being connected to the third and sixth terminals of the detection circuit, respectively, the emitters of the multiple emitter transistor being connected to the fourth and fifth terminals of the detection circuit, respectively.

24. The integrated circuit of claim 1, wherein:

the data output means comprises a plurality of first transistor circuits, each providing output voltage between first and second circuit nodes thereof in response to at least one input signal; and the detector comprises a plurality of detection circuits which are coupled to the impedance circuit.

25. The integrated circuit of claim 24, wherein each of the detection circuits of the detector is associated with the respective first transistor circuit of the data output means.

26. The integrated circuit of claim 25, wherein each of the first transistor circuit of the data output means receives a respective input signal.

27. The integrated circuit of claim 25, wherein each of the detection circuits further comprises a sixth terminal for receiving the fourth operating voltage.

28. A circuit test method comprising the steps of:

configuring a data output circuit comprising a plurality of first transistor circuits, each first transistor circuit having first and second circuit nodes;

configuring a detector comprising an impedance circuit and a plurality of detection circuits which are coupled to the impedance circuit;

associating each of the detection circuit with the respective first transistor circuit;

operating the data output circuit by first and second operating voltages;

operating the detector by a third operating voltage;

feeding the third operating voltage to the detection circuit via the impedance circuit;

feeding at least one input signal to the first transistor circuit of the data output circuit, so that the first transistor circuit provides output voltage between the first and second circuit nodes, in response to the input signal; and providing an output indicating an abnormal voltage excursion from the detector.

29. The circuit test method of claim 28, wherein the step of feeding the third operating voltage comprises the step of feeding the same voltage as the second operating voltage.

30. The circuit test method of claim 28, wherein the step of feeding the third operating voltage comprises the step of feeding a test voltage as the third operating voltage.

31. The circuit test method of claim 28, wherein the step of feeding the input signal comprises the step of feeding a plurality of input signals, so the first transistor circuit receives the respective input signal.

32. A circuit test method comprising the steps of:

configuring a chain of transistor circuits, each having first and second circuit node which are connected to inputs of the other transistor circuit;

sensitizing outputs one after the other transistor circuit; and applying toggling input signals.

* * * * *